United States Patent [19]
Furukawa et al.

[11] Patent Number: 5,584,118
[45] Date of Patent: * Dec. 17, 1996

[54] PRODUCTION CONTROL WITH CENTRALIZED PHYSICAL DISTRIBUTION CONTROL BETWEEN STORAGE AND PRODUCTION CELLS

[75] Inventors: Satomi Furukawa; Shozo Suzuki; Yuuji Seki; Jun Saitou, all of Kawasaki, Japan

[73] Assignee: Fujitsu Limited, Kanagawa, Japan

[ * ] Notice: The term of this patent shall not extend beyond the expiration date of Pat. No. 5,237,508.

[21] Appl. No.: 189,938

[22] Filed: Feb. 1, 1994

Related U.S. Application Data

[63] Continuation of Ser. No. 886,740, May 20, 1992, abandoned.

[30] Foreign Application Priority Data

| May 24, 1991 | [JP] | Japan | 3-148174 |
| May 24, 1991 | [JP] | Japan | 3-148176 |
| May 24, 1991 | [JP] | Japan | 3-148177 |

[51] Int. Cl.⁶ .......................... G06F 19/00; H05K 13/00
[52] U.S. Cl. .................. 29/701; 29/703; 29/711; 29/739; 364/468.1
[58] Field of Search .............. 29/702, 703, 711, 29/739, 740, 742, 791, 33 P; 414/222; 901/7; 364/468

[56] References Cited

U.S. PATENT DOCUMENTS

| 4,027,246 | 5/1977 | Caccoma et al. |  |
| 4,283,847 | 8/1981 | May | 29/742 |
| 4,722,653 | 2/1988 | Williams et al. | 29/711 |
| 5,024,570 | 6/1991 | Kiriseko et al. | 414/222 |
| 5,125,783 | 6/1992 | Kawasoe et al. | 414/222 |
| 5,237,508 | 8/1993 | Furukawa et al. | 364/468 |
| 5,262,954 | 11/1993 | Fujino et al. | 364/468 |

FOREIGN PATENT DOCUMENTS

| 456218A2 | 11/1991 | European Pat. Off. | 29/829 |
| 62-290604 | 12/1987 | Japan . | |
| 63-300844 | 12/1988 | Japan . | |
| 1183344 | 7/1989 | Japan . | |
| 265958 | 3/1990 | Japan . | |
| 2198721 | 8/1990 | Japan . | |
| 324795 | 2/1991 | Japan . | |
| 3178200 | 8/1991 | Japan . | |
| 5633313 | 4/1992 | Japan . | |
| 61123150 | 6/1992 | Japan . | |

*Primary Examiner*—M. Rachuba
*Assistant Examiner*—Kenneth J. Hansen

[57] ABSTRACT

A production control system is disclosed which comprises a plurality of processing apparatuses each thereof including a single cell or a plurality of identical cells, a storage for temporarily storing objects to be processed, a transportation facility for transporting the objects to be processed between the cells or between the cell and the storage, a plurality of cell controllers each thereof controlling each cell, a physical distribution control system for controlling the transportation facility, and a charge control system for issuing a transportation command to the physical distribution system in response to a request for sending in and a request for taking out from the cell controllers as well as a notice of completion of transportation from the physical distribution control system.

8 Claims, 24 Drawing Sheets

| Rack No. | Kind of Product | Group No. | | | | State of Progress | | | |
|---|---|---|---|---|---|---|---|---|---|
| | | #1 | #2 | ---- | #N | #1 | #2 | ---- | #N |
| R1 | Z1 | G1 | G4 | | Gx | ○ | ○ | | |
| R2 | Z1 | G1 | G4 | | Gx | ○ | ○ | | |
| R3 | Z2 | G1 | G5 | | Gy | ○ | | | |
| R4 | Z2 | G1 | G5 | | Gy | ○ | | | |
| R5 | Z3 | G2 | G4 | | Gy | ○ | | | |
| R6 | Z4 | G3 | G4 | | Gy | ○ | | | |
| | | | | | | | | | |

FIG. 10B

| Kind of Product | Number of Racks |
|---|---|
| Z1 | 2 |
| Z2 | 2 |
| Z3 | 1 |
| Z4 | 1 |
|  |  |

| Group No. | Number of Racks |
|---|---|
| G1 | 4 |
| G2 | 1 |
| G3 | 1 |
| G4 | 4 |
| G5 | 2 |

| Rack | Group | Kind of Product |
|------|-------|-----------------|
| R 1  | G 1   | Z 1             |
| R 2  | G 1   | Z 1             |
| R 3  | G 1   | Z 2             |
| R 4  | G 1   | Z 2             |
| R 5  | G 2   | Z 3             |
| R 6  | G 3   | Z 4             |

| A | B | C | | | | | D | E | F | G | H | I |
|---|---|---|---|---|---|---|---|---|---|---|---|---|
|   |   | 1 | 2 | 3 | 4 | 5 |   |   |   |   |   |   |
| 010 | ID Labeling | 010 |   |   |   |   | 02 | 01 | 00 | 00 | 01 | 00 |
| 030 | Solder Printing | 030 |   |   |   |   | 02 | 01 | 01 | 00 | 01 | 00 |
| 040 |   | 050 | 051 |   |   |   | 01 | 01 | 01 | 01 | 01 | 01 |
| 041 |   | 060 |   |   |   |   | 01 | 01 | 01 | 01 | 01 | 01 |
| 042 | ----- |   |   |   |   |   |   |   |   |   |   |   |
| 200 |   | 130 |   |   |   |   | 03 | 01 | 00 | 01 | 00 | 00 |

PRODUCTION CONTROL WITH CENTRALIZED PHYSICAL DISTRIBUTION CONTROL BETWEEN STORAGE AND PRODUCTION CELLS

This is a continuation of application Ser. No. 07/886,740, filed May 20, 1992 now abandoned.

BACKGROUND OF THE INVENTION

1. Field of the Invention

The present invention generally relates to a production control system applicable to a production line including processing equipment such as manufacturing, testing, and correcting apparatuses and physical distribution equipment and, more particularly, to a production control system effectively achieving multikind and small-quantity production.

With the recent reduction in size, lightening in weight, and diversification of functioning of products in the field of electronic equipment, printed circuit board units constituting such equipment are increasing their packaging density. As a result, these component parts are increasing in number and becoming more and more miniaturized and complicated. Consequently, it has become difficult to mount such component parts by manual operation and, hence, many factories have come to introduce various automatic parts mounting machines. Because of increase in labor costs, effective and unmanned running of such expensive machines to a highest possible degree are desired by those factories. On account of diversification of customers' needs and decrease in life cycle of products, factories are compelled to do multikind and small-quantity production and to deliver their products in short delivery times. Also for this reason, there are great desires for attainment of unmanned and high-efficiency operations of production lines.

2. Description of the Related Art

Various attempts have so far been made to practice unmanned and high-efficiency operation of an individual apparatus disposed in a production line, for processing a single kind of product. However, a system achieving synthesized unmanned and high-efficiency operation of a system for an entire production line capable of manufacturing a variety of products is not yet developed to the stage where it is put to practical use.

As a method for achieving synthesized unmanned and high-efficiency operation of a system including an entire production line, there is one in which physical distribution and dealing (assembling, testing, correction, etc.) with objects to be processed are executed in accordance with prescribed programs. However, in such system with sequential control, as it is called, applied to an entire line, it has been difficult to quickly respond to a change in the kind of product and, hence, it has been difficult to achieve effective multikind and small-quantity production.

SUMMARY OF THE INVENTION

An object of the present invention is the provision of a versatile product control system suited for use in synthesized unmanned and high-efficiency operation of an entire production line for manufacturing a variety of products.

A production control system according to the present invention comprises a plurality of processing apparatuses each thereof including a single cell or a plurality of identical cells, storage means for temporarily storing objects to be processed, transportation means for transporting the objects to be processed between the cells or between the cell and the storage means, a plurality of cell controllers each thereof controlling each cell, a physical distribution control system for controlling the transportation means, and a charge control system for issuing a transportation command to the physical distribution system in response to a request for sending in and a request for taking out from the cell controllers as well as a notice of completion of transportation from the physical distribution control system.

In a preferred mode for carrying out the invention, some of the plurality of processing apparatuses are provided with part mounting machines as the cells, and the objects to be processed are constituted of racks, each of which stores printed circuit boards for each kind of product, and pallets, each of which holds a plurality of cartridges, in which a number of parts of the same kind to be mounted are placed, according to processing in the part mounting machine.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 10A is a diagram showing an example of a table 103;

FIG. 10B is a diagram showing an example of a table 61B;

FIG. 10C is a diagram showing an example of a table 61A;

FIG. 11 is a diagram explanatory of unitization of the racks to be charged to the processing apparatus #1 extracted from FIG. 10A;

FIG. 19 is a diagram showing an example of a table 142 in FIG. 17;

DESCRIPTION OF THE PREFERRED EMBODIMENTS

Figure 1:
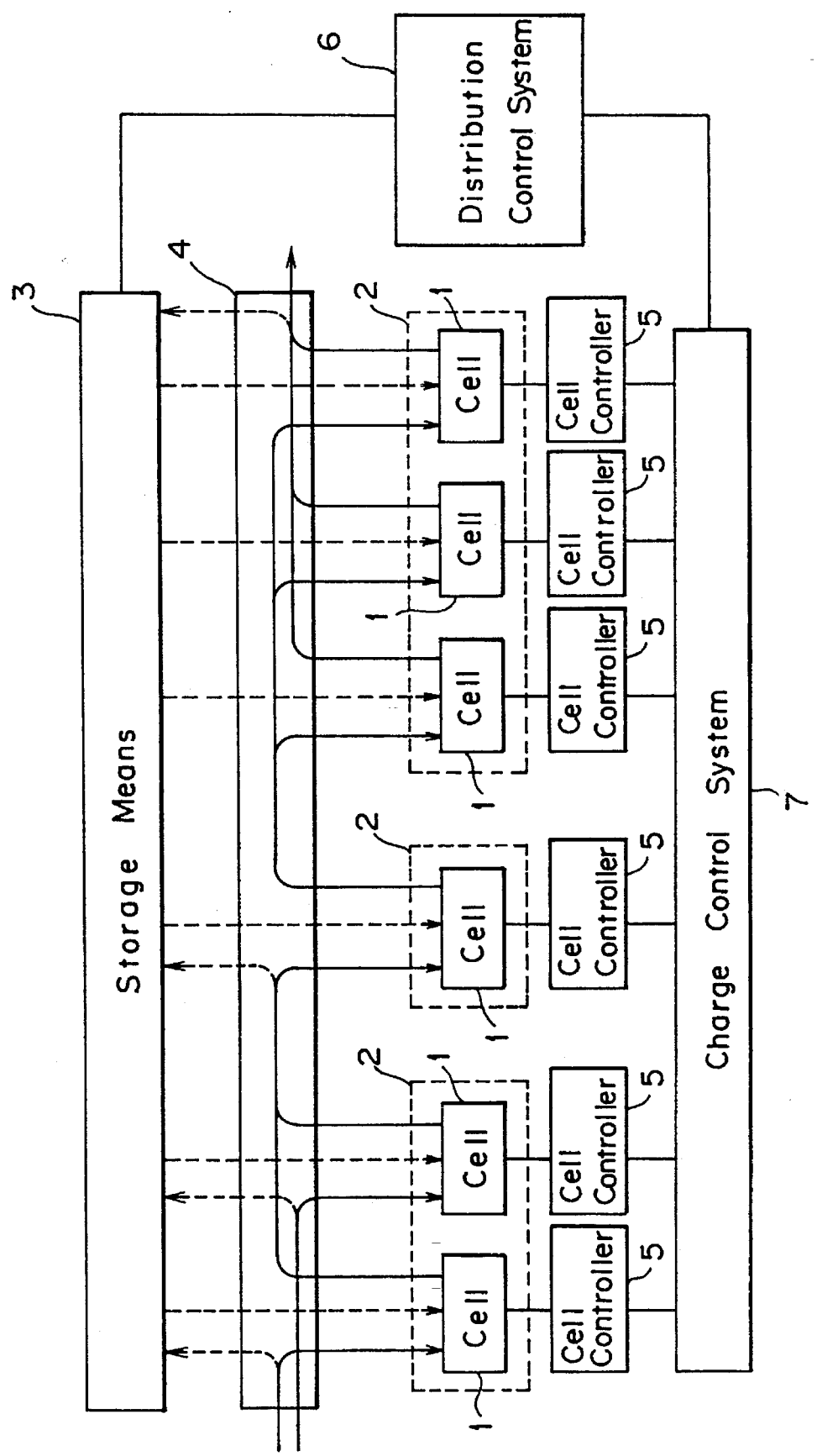
FIG. 1 is a diagram showing a basic structure of a production control system of the present invention.

An embodiment of the present invention will be described below in detail with reference to the accompanying drawings. Throughout the drawings, like objects are denoted by like reference characters. Sometimes, like objects may be denoted by different reference characters.

FIG. 1 is a block diagram showing a basic structure of a production control system of the present invention. Each of a plurality of processing apparatuses 2 includes a single or a plurality of identical cells 1. Objects to be processed are temporarily stored in a storage means 3. A transport means 4 transports the objects to be processed between cells 1 or between the cell 1 and the storage means 3. A plurality of cell controllers 5 control their respective cells 1. A distribution control system 6 controls the transport means 4. A charge control system 7 issues a transportation command to the distribution control system 6 in response to a request for sending in and a request for taking out of an object from the cell controllers 5 and a notice of completion of transportation from the distribution control system 6.

According to the basic structure of FIG. 1, the objects to be processed are delivered between each processing apparatus and the storage means and charging of the objects to be processed suited to conditions of the production line can be achieved. Therefore, an expansion of the system can be made without the need for making a great change in the program. In other words, a versatile production control system can be provided. Further, emergencies such as a fault in an apparatus can be quickly coped with.

A cell 1 is for example a part mounting machine. The above described objects to be processed are for example racks in which printed circuit boards for each kind of product are placed and pallets on which a plurality of cartridges, each cartridge containing a plurality of parts of the same kind to be mounted, are placed according to the processing made by each part mounting machine.

In this case, not only automatic part mounting is possible but also automatic supplies of parts etc. to the part mounting machines are possible. Therefore, much contribution is made to the establishment of an unmanned production line suited to multikind and small-quantity production.

Figure 2:
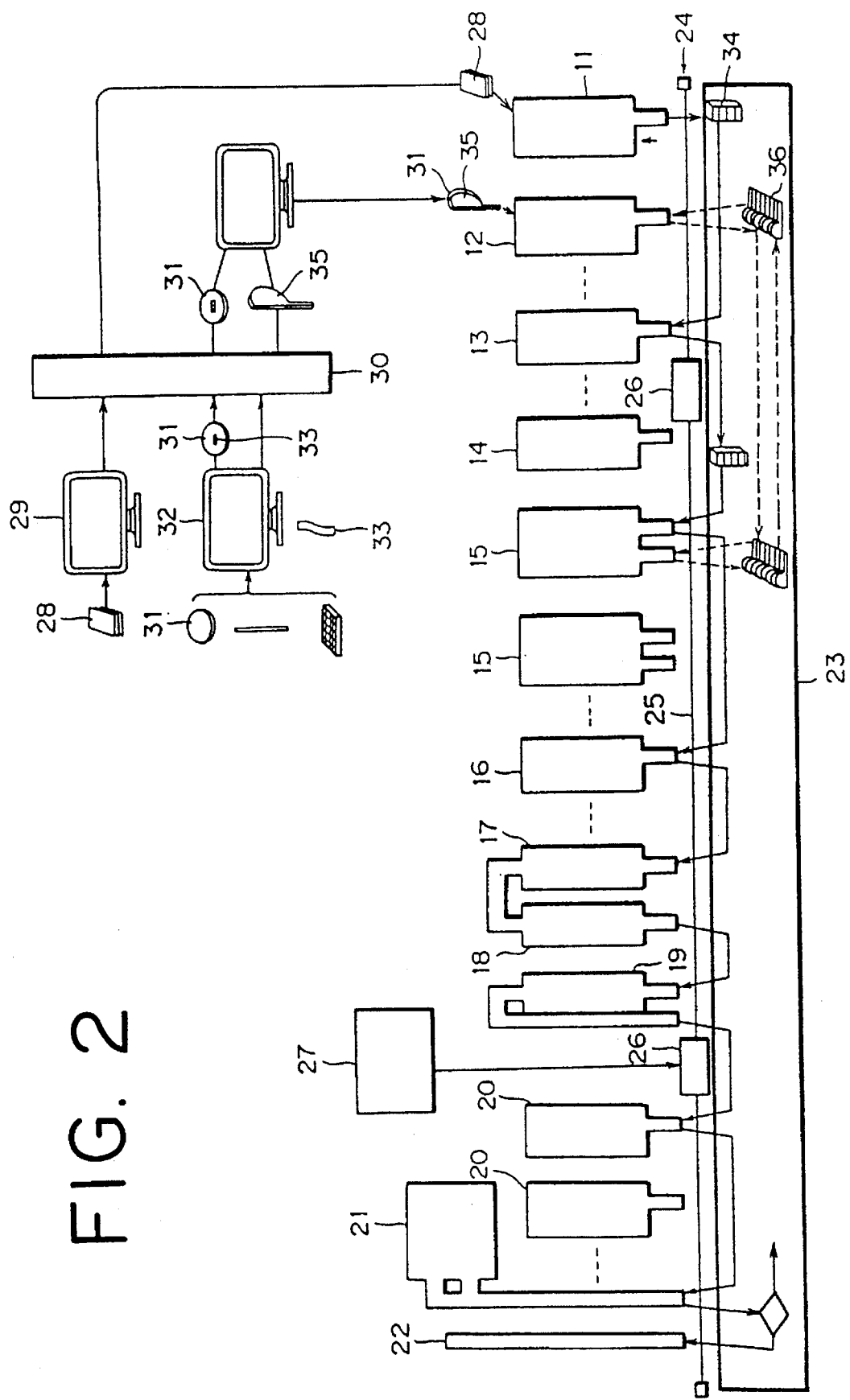
FIG. 2 is an explanatory diagram of a production line to which the present invention is suitably applicable.

FIG. 2 is an explanatory diagram of a production line of printed circuit board units to which the present invention is suitably applicable. Reference numerals 11 to 22 denote cells constituting various processing apparatuses in the production line. The particular function of each cell will be described below.

An ID labeler 11, the processing apparatus at the head, attaches an ID label to each printed circuit board 28 supplied thereto and sends out the boards put in a rack 34 for each kind of product. An automatic organizer 12 sets cartridges 35 supplied thereto on each pallet 36 in a predetermined order and sends them out. A solder printer 13 applies solder cream to predetermined positions in a conductive pattern on the printed circuit board by screen printing. An adhesive applier 14, when parts are to be mounted on the rear side of the printed circuit board, applies an adhesive to the rear side for temporarily fixing the parts thereto. When parts are to be mounted only on one side (the front side) of the printed circuit board, the adhesive applier 14 is not used. A small part mounting machine 15 and a special-form part mounting machine 16 automatically mount small parts and special-form parts on the printed circuit board, respectively. Small parts, for example chip resistors, are delivered in such a style that numbers (for example, 1000 to 2000) of the parts of the same specification are put, at regular intervals in the longitudinal direction, in a band-shaped part case, which is coiled around a reel. The reel 31 containing numbers of small parts is mounted in a cartridge 35 and such cartridges 35 placed on a pallet 36 are supplied to the part mounting machine. A reflow furnace 17 performs fellow soldering for parts mounted on the printed circuit board. A whole surface washing machine 18 washes the printed circuit board gone through the reflow soldering. A hardening furnace 19 hardens the adhesive applied to the printed circuit board by the adhesive applier 14. A visual inspection apparatus 20 performs a visual inspection, optically or with X-ray, of the printed circuit board gone through the soldering. A manual correction apparatus 21 supplies such printed circuit boards that are detected to be faulty by the visual inspection apparatus 20 to the position by the side of the operator who corrects them manually or discharges such printed circuit boards from that position. When printed circuit boards with parts mounted only on one side thereof are produced, the printed circuit board discharged from the manual correction apparatus 21 is sent to a discharge station 22, while printed circuit boards with parts mounted on both sides thereof are produced, the printed circuit board discharged from the manual correction apparatus 21 is returned to the solder printer 13. The discharge station 22, as the final processing apparatus, discharges printed circuit boards that became completed products going through the inspection and correction, by means of a belt conveyer or the like. Reference numeral 23 denotes a rack/pallet storage in which racks and pallets are temporarily stored. Transportation of racks and pallets between the cells 11 to 22 and between each cell and the storage 23 is performed by a transport apparatus 24. The transport apparatus 24 comprises rails 25 laid between cells and the storage, a single or a plurality of self-propelled cars traveling on the rails 25 with a rack or a pallet mounted thereon, and transport control system 27 for controlling the operation of the self-propelled car 26.

Printed circuit boards 28 delivered to a factory are temporarily stored on component storing shelves 30 after data thereof have been input to a personal computer 29 for arrival control. Components such as reels 31 (or collections of components) are stored on the components storing shelves 30 after data thereof have been input to a personal computer for arrival control 32 and an ID label 33 has been attached to each thereof. The printed circuit boards supplied to the line from the ID labeler 11 are stored in the rack 34 and transported by the self-propelled car 26 between cells, except the automatic organizer 12, and the storage 23. The reels 31 are mounted in a cartridge 35 and supplied to the automatic organizer 12, and the cartridges 35 with the reels 31 placed therein are received on a pallet 36 in a predetermined order and supplied to the line. The pallet 36 is transported by the self-propelled car 26 between the automatic organizer 12, the small part mounting machine 15, and the storage 23.

Arrangement of cells in the line and the number of cells for each processing apparatus are suitably decided according to such factors as the length of the processing time in each processing apparatus. When it is considered that cells are to be increased in one processing apparatus, for example, a great change will have to be made in the control program, as described above, if a sequential control system in the prior art is used.

In the present embodiment, each cell is provided with the cell controller and it is arranged such that transportation of the racks and pallets is controlled in accordance with information exchanged between the cell controllers and the charge control system. Further, the number of cells constituting each processing apparatus is adapted to be changed suitably and readily according to production planning, as described later, so that effective line operation can be achieved.

Figure 3:
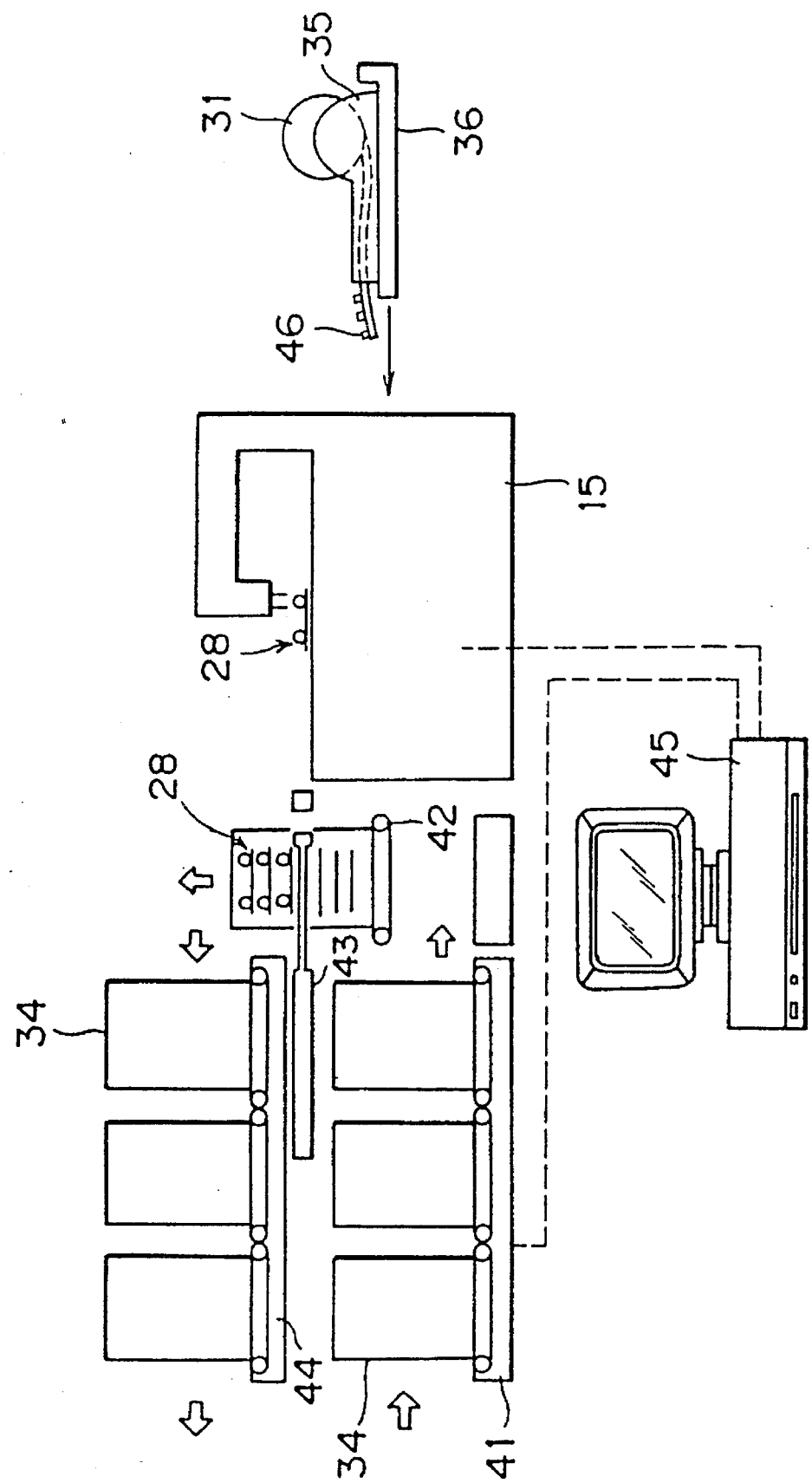
FIG. 3 is a diagram explanatory of functioning of a small part mounting machine and its cell controller.

Referring now to FIG. 3, the outline of a function of a cell controller will be described below with the small part mounting machine taken as an example. A rack 34 carried to the small part mounting machine 15 by a self-propelled car is supplied onto a lifter 42 by a supply belt conveyer 41 and a desired printed circuit board 28 is sent into the small part mounting machine 15 by a pusher 43. In the small part mounting machine 15, small parts 46 supplied from cartridges 35 carried in by a pallet 36 are mounted on specified positions on the printed circuit board 28. The printed circuit board 28 with all the parts mounted thereon is returned to the rack 34 and carried out by a discharge conveyer 44 to a self-propelled car.

The cell controller 45 is monitoring such a sequence of operations as described above and transmits a request for sending in and a request for taking out of the rack and the pallet to and from the small part mounting machine 15 to a below described charge control system.

Figure 4:
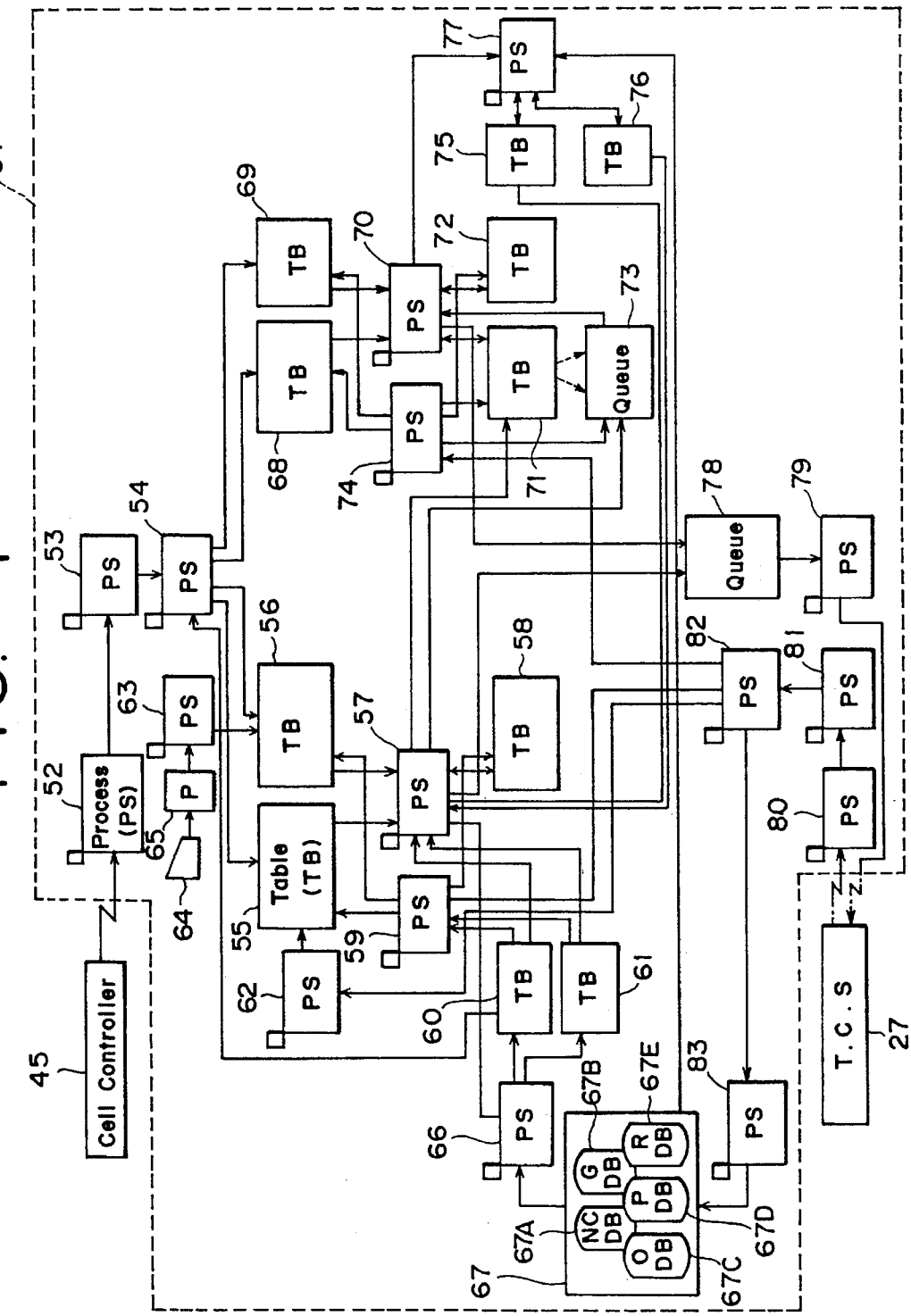
FIG. 4 is a diagram of processes interrelationships in a charge control system.

FIG. 4 is a diagram of processes interrelationships showing relationships between process and table (in some cases, relationships between processes). The portion enclosed by the dotted line 51 in the diagram corresponds to the charge control system.

Requests for sending in/taking out from the cell controllers 45 are delivered to a sending in/taking out reception process 54 through a socket reception process 52 and a command distribution system 53 in the order named. Requests for sending in of a rack and requests for taking out of a rack from the sending in/taking out reception process 54 are stored in tables 55 and 56, respectively, and such requests for sending in/taking out are monitored by a process 57. A table 58 stores information about racks stored in the storage. A table 60 stores information about routes through which the racks are to be transported and the like. The contents stored in the tables 55, 56, 58, and 60 are successively updated by a process 59 in accordance with notices of completion of transportation from a process 82 and others. A process 62 is monitoring the number of all the racks within the line according to the notices of completion of transportation from the process 82 and others and sets up a flag in the table 55 at the portion corresponding to the processing apparatus at the head, whereby sending in of the rack from the processing apparatus at the head is restricted and the total number of the racks within the line can be maintained not to surpass a limit value. A load calculating process 63 is provided for the sake of the later described restriction of charging. This process calculates the load at a portion in the line (to be concrete, the time required for a rack to go from a processing apparatus to another processing apparatus) and sets up a flag to restrict a charge in the table 56, referring to parameters 65 such as the apparatus operating time input from an input apparatus 64. A table 61 stores information about racks belonging to a group satisfying later described certain conditions, for example, the number of racks belonging to the group. A process 66 participates in ID labeling through interprocess communication with the process 57, according to data from a data base 67.

To achieve control of charging of pallets corresponding to the control of charging of racks, there are provided, corresponding to the processes and tables for the racks, a table 68 storing requests for taking out of a pallet, a table 69 storing requests for sending in of a pallet, a process 70 monitoring requests for sending in/taking out of a pallet, a table 71 about pallets before use stored in the storage, a table 72 about pallets after use stored in the storage, a queue 73 for controlling the pallet for each cell, a process 74 updating contents stored in the tables 68, 69, and 72, and the queue 73, a table 75 storing information about routes through which pallets are transported and the like, a table 76 for controlling the number of pallets, and a process 77 for confirming completion of organization of pallets.

Requests for sending in from the processes 57 and 70 are successively stored in a queue 78 and, according to the contents, a transmission command is issued therefrom to the transportation control system 27 through a socket transmission process 79. The notice of completion of transportation from the transportation control system 27 is sent to the processes 59, 62, 74, and 83 through a socket reception process 80 and a command distribution process 81 in the order named and further through a process 82. A process 83 updates the data base 67 according to the need.

The data base 67 comprises numerical control (NC) data base 67A storing NC data for operating the small part mounting machine, a group data base 67B storing information about the grouping of objects to be processed according to which they are charged, an order data base 67C storing information about manufacturing conditions of products and the like, a pallet data base 67D storing information about pallets, and a rack data base 67E storing information about racks.

Figure 5:
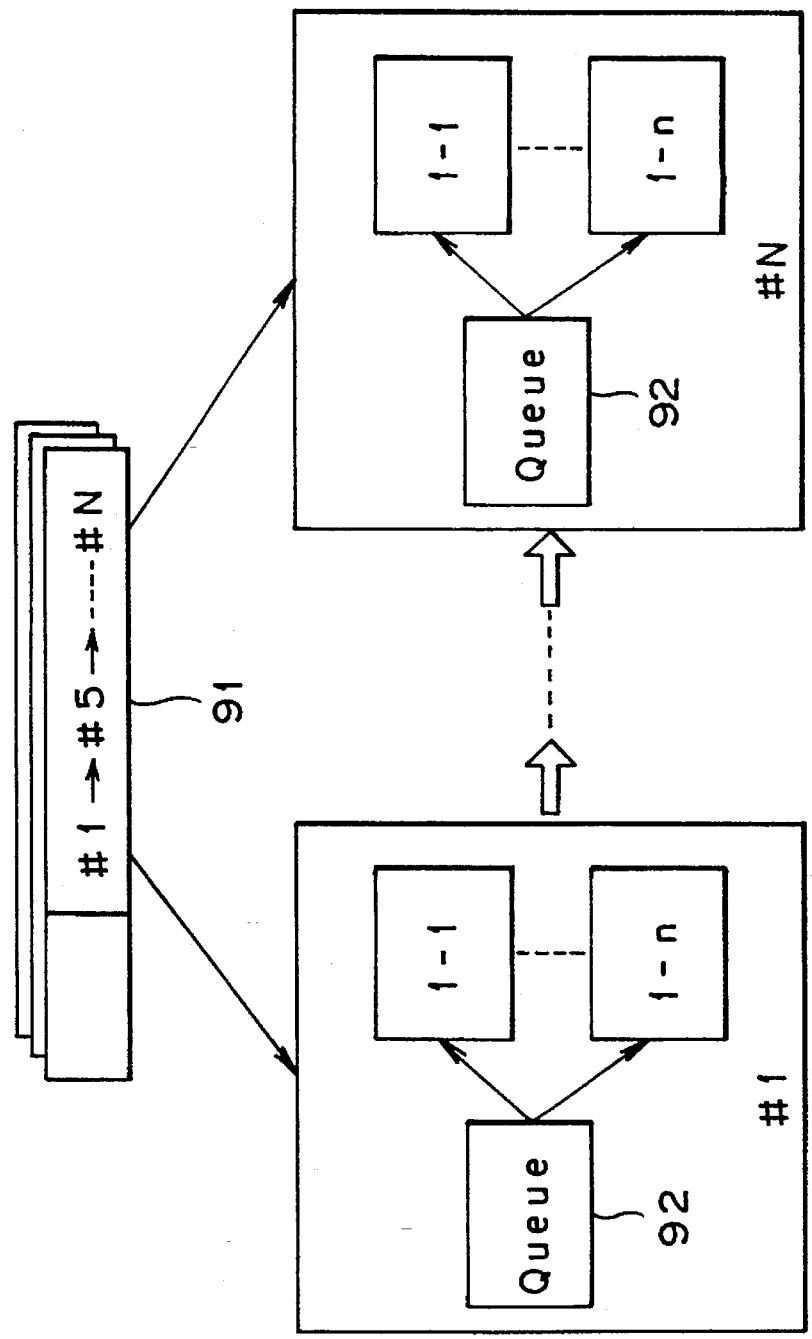
FIG. 5 is an explanatory diagram of an embodiment in which each processing apparatus includes a plurality of cells.

Now, we assume that there is an arrangement in which the processing apparatuses #1, #2, . . . , #N are each including a plurality of cells 1—1, 1–2, . . . , 1-n as shown in FIG. 5. In such case, it is preferable to provide a route master 91 storing information, for each of the racks, about the route through which each rack must be transported according to the kind of product and a queue 92 storing information, for each processing apparatus, about waiting conditions of racks in the storage, and to arrange so that transportation commands are issued on the basis of contents stored in the route master 91 and the queue 92 as well as requests for sending in/taking out from cells. The requests for sending in and sending out from the cells are stored in the tables 55 and 56 in FIG. 4, respectively. Incidentally, the route master 91 is included in the table 60 in FIG. 4 and the queue 92 is included in the table 58 in FIG. 4.

Figure 6:
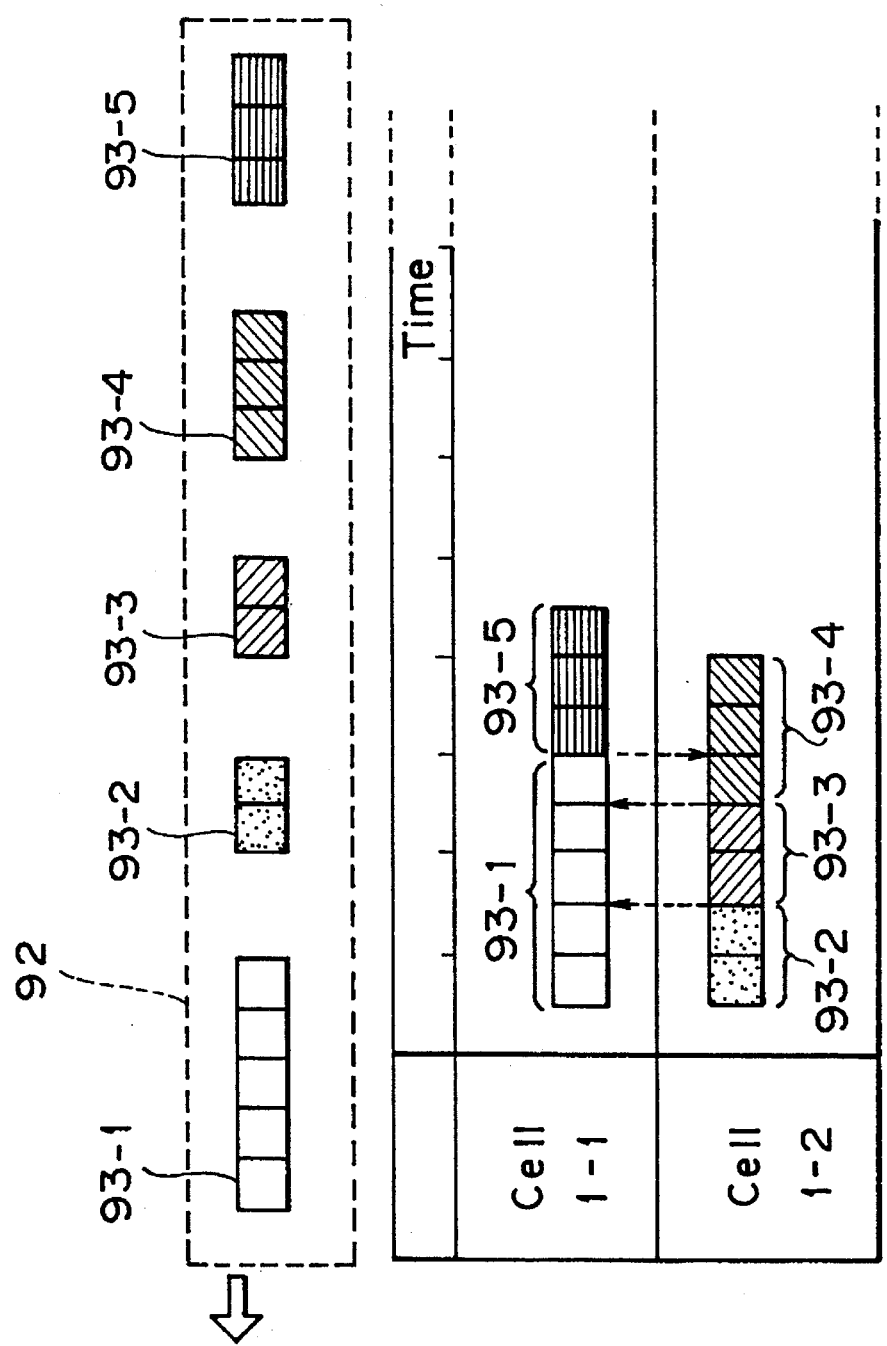
FIG. 6 is a diagram explanatory of shared processing by two cells constituting a processing apparatus.

According to the embodiment of FIG. 5, a transportation command can be issued by decision made on the request for sending in/taking out from each cell on a real-time base. Hence, it becomes possible to shorten the idle time of each cell to thereby improve the production efficiency. This will be described below with reference to FIG. 6 showing processing shared by two cells which constitute a processing apparatus.

We assume now that a group 93-1 formed of data of five racks, groups 93-2 and 93-3 formed of data of two racks each, and groups 93-4 and 93-5 formed of data of three racks each have been input in the order named to the queue 92 of the processing apparatus formed of cells 1—1 and 1-2. It is also assumed that the capacity of cells for processing the respective racks are equal with each other. In such case, the group 93-1 is first charged to the cell 1—1. In succession thereto, the group 93-2 is charged to the cell 1-2. When processing for the group 93-2 has been finished, the cell 1—1 is still in operation. Hence, the group 93-3 is charged to the cell 1-2. Also, when processing for the group 93-3 has been finished, the cell 1—1 is still in operation and, hence, the group 93-4 is chatted to the cell 1-2. The final group 93-5 is charged to the cell 1—1 after processing for the group 93-1 in the cell 1—1 has been finished. According to the embodiment shown in FIG. 5 and FIG. 6 as described above, a plurality of cells in the same processing apparatus can be operated effectively and smoothly. Therefore, the production efficiency can be increased.

Now, in the case where objects for different kinds of products are charged to a production line for performing multikind and small-quantity production, it becomes necessary to set up or change processing conditions in each processing apparatus, that is, to make provision (setup) such as adjustments of the apparatus and replacement of the materials. For example, in the setup of the small part mounting machine, great man-hours are required for exchanging the pallet. Hence, as for racks which can be processed with the same setup made therefor, it is preferred to process them in the same sequence as much as possible. Accordingly, racks are grouped according to conditions for setting up as described above and charging of racks group by group is executed.

Figure 7:
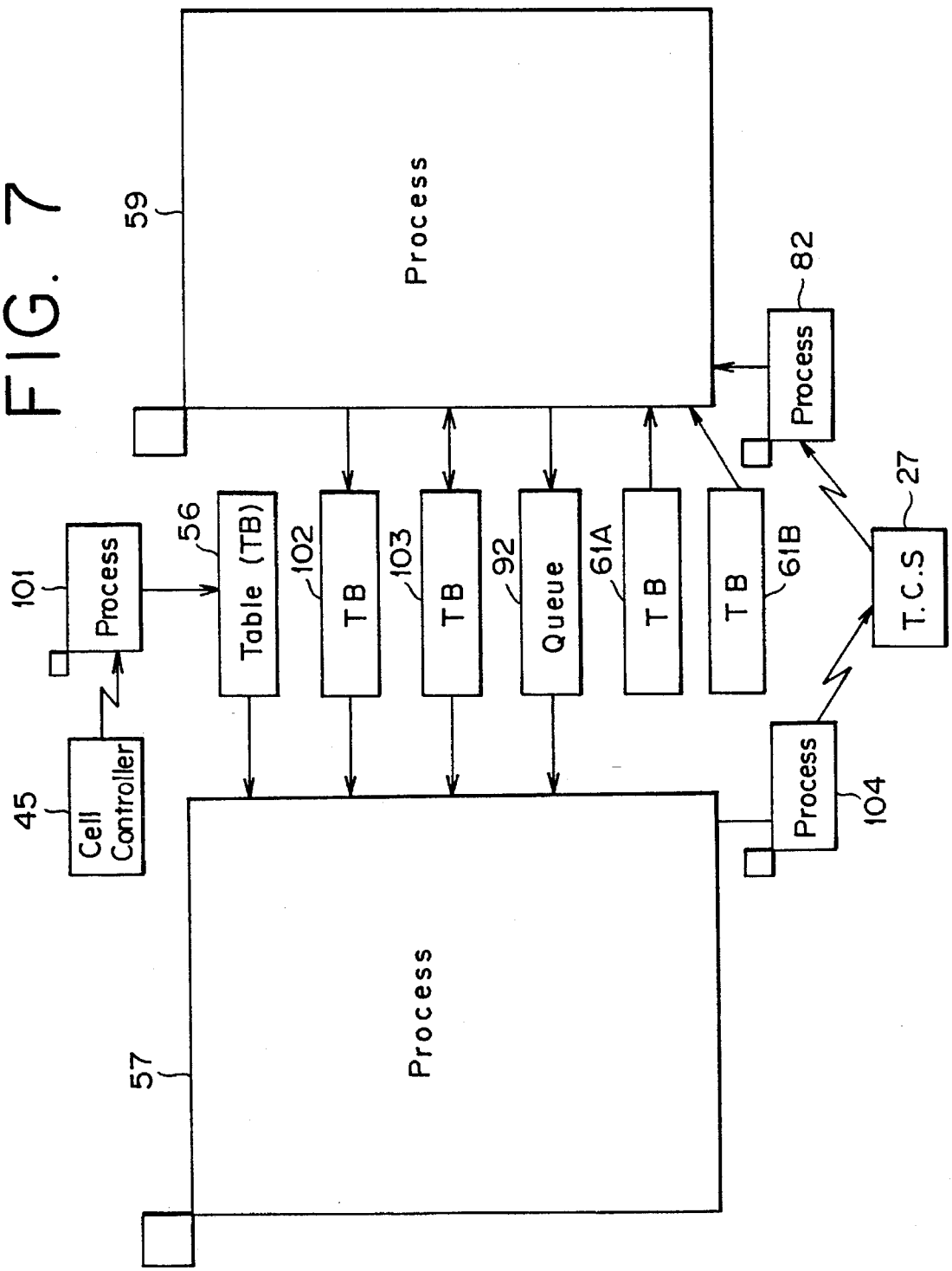
FIG. 7 is a diagram of processes interrelationships in an embodiment of a charge control system in which charging of racks for each group is made possible.

FIG. 7 is a diagram of processes interrelationships in a charge control system in which group-by-group charging of racks is made possible. A process 101 sends a request for sending in of a rack from the cell controller 45 to the table 56 of requests for sending in of a rack. This process corresponds to the socket reception process 52 and the command distribution process 53 in FIG. 4. A table 103 stores information to which kind of product the printed circuit boards stored in a rack belong, information to which group of processing conditions the processing condition of the rack of each processing apparatus belongs, and information up to which processing apparatus in the route, through which a rack is transported, the rack has progressed. This table 103 is included in the table 60 in FIG. 4. A table 61A stores information, for each group, as to the number of racks belonging to the same group. A table 61B stores information, for each kind of product, as to the number of racks belonging to the same kind of product. These tables 61A and 61B are included in the table 61 in FIG. 4. Restrictions on the request for sending in are set up based on the information about the progress from the table 103 and information about the numbers of racks from the tables 61A and 61B, and the restrictions are stored in a table 102. The process 57 issues, on the basis of the contents stored in the tables 56, 102, and 103 and the queue 92, a transportation command to the transportation control system 27 through a transportation command output process 104. The transportation command output process 104 corresponds to the queue 78 and the socket transmission process 79 in FIG. 4. The process 59 functions, in the present embodiment, according to the notice of completion of transportation incoming from the transportation control system 27 through the process 82 and contents stored in the tables 103, 61A and 61B, to update each table.

An example of the table 103 will be described with reference to FIG. 10A. The rack No. corresponds to each rack one to one. In this example there are set up six rack Nos. R1 to R6. The kind of product indicates the kind of product for which the completed printed circuit board unit is used. The rack Nos. R1 and R2 are commonly for the kind of product Z1, the rack Nos. R3 and R4 are commonly for the kind of product Z2, and the rack Nos. R5 and R6 are for the kinds of product Z3 and Z4, respectively. The group No. is that of a group of racks which can be processed commonly by each processing apparatus. More specifically, for the processing apparatus #1, the rack Nos. R1 to R4 belong to the group G1, the rack no. R5 belongs to the group G2, and the rack No. R6 belongs to the group G3. For the processing apparatus #2, the rack Nos. R1, R2, R5, and R6 belong to the group G4 and the rack Nos. R3 and R4 belong to the group G5. Thus, the groupings of the racks differ with processing apparatuses. For example, for the small part mounting machine, the racks that can be processed without exchanging a pallet are put into the same group. As for the state of progress, it is indicated that the racks specified by the rack Nos. R1 and R2 have gone through both the processing apparatuses #1 and #2, whereas the racks specified by the rack Nos. R3 to R6 have gone through the processing apparatus #1.

FIG. 10B is a diagram showing an example of the table 61B. In this example, the table stores data indicating that the number of racks belonging to the kind of product Z1 is two (rack Nos. R1 and R2), the number of racks belonging to the kind of product Z2 is two (rack Nos. R3 and R4), the number of rack belonging to the kind of product Z3 is one (rack No. R5), and the number of rack belonging to the kind of product Z4 is one (rack No. R6).

FIG. 10C is a diagram showing an example of the table 61A. In this example, the table stores data indicating that the number of racks belonging to the group No. G1 is four (R1, R2, R3, and R4), the number of racks belonging to the group No. G2 is one (R5), the number of racks belonging to the group No. G3 is one (R6), the number of racks belonging to the group No. G4 is four (R1, R2, R5, and R6), and the number of racks belonging to the group No. G5 is two (R3 and R4).

Figure 10D:
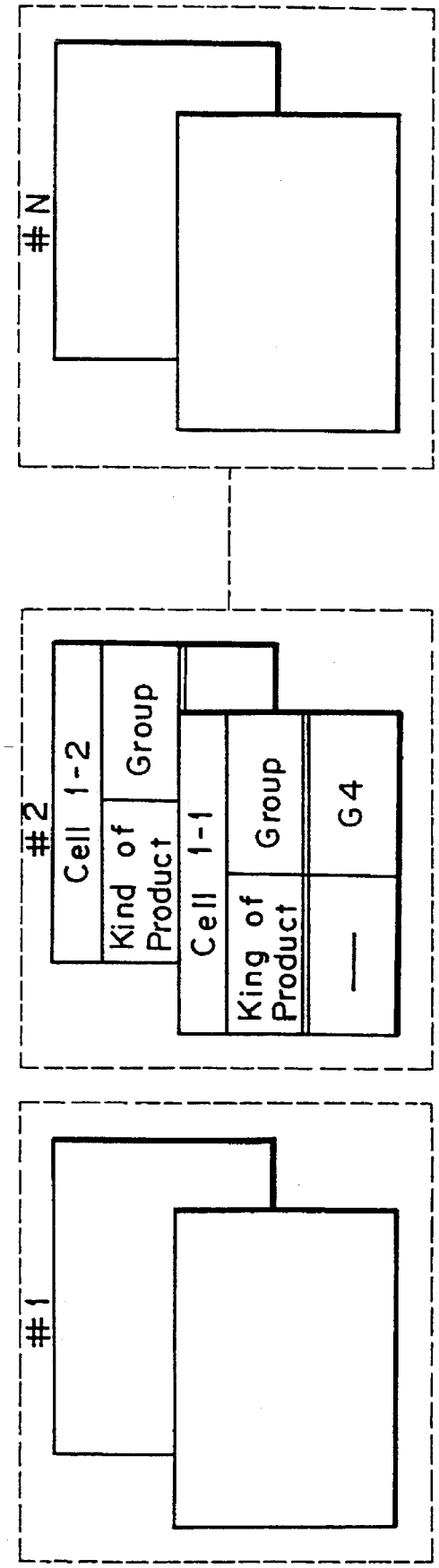
FIG. 10D is a diagram showing an example of a table 102.

FIG. 10D is a diagram showing an example of the table 102. The table 102 is set up for each processing apparatus and for each cell. In the example shown, the rack chargeable to the cell 1—1 in the processing apparatus #2 is limited to those belonging to the group No. G4.

When the table 102 stores contents as shown in FIG. 10D, if the contents stored in the table 103 shown in FIG. 10A are also taken into consideration, it is known that one of the racks whose rack Nos. are R1, R2, R5, and R6 for which a predetermined setup has been made is in process in the cell 1—1 of the processing apparatus #2.

Figure 8:
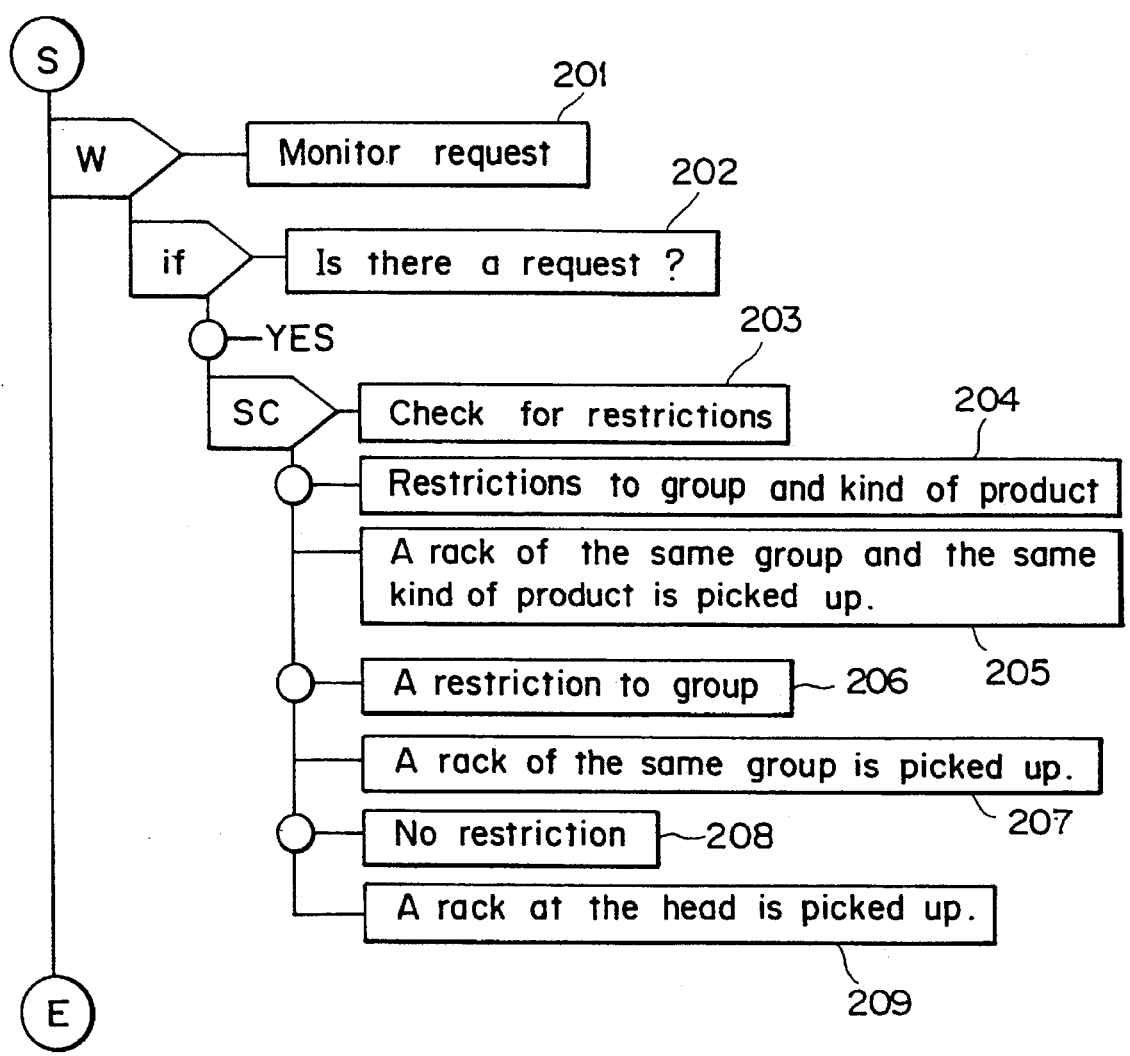
FIG. 8 is a flow chart of a process 57 in FIG. 7.

FIG. 8 is a flow chart of the process 57. First, in the step 201, the process enters a loop to monitor a request for sending in. When it is decided that there is a request in the step 202, the process advances to the step 203 and checks for restrictions. If it is decided that there are restrictions as to group and kind of product (step 204), the process advances to the step 205 and, therein, picks out a rack of the same group and the same kind of product from the queue and issues a transportation command. When it is decided that there is a restriction as to group (step 206), the process advances to the step 207 and, therein, picks out a rack of the same group from the queue and issues a transportation command. When there is no restriction (step 208), the process advances to the step 209 and, therein, picks out a rack at the head of the queue and issues a transportation command.

Figure 9:
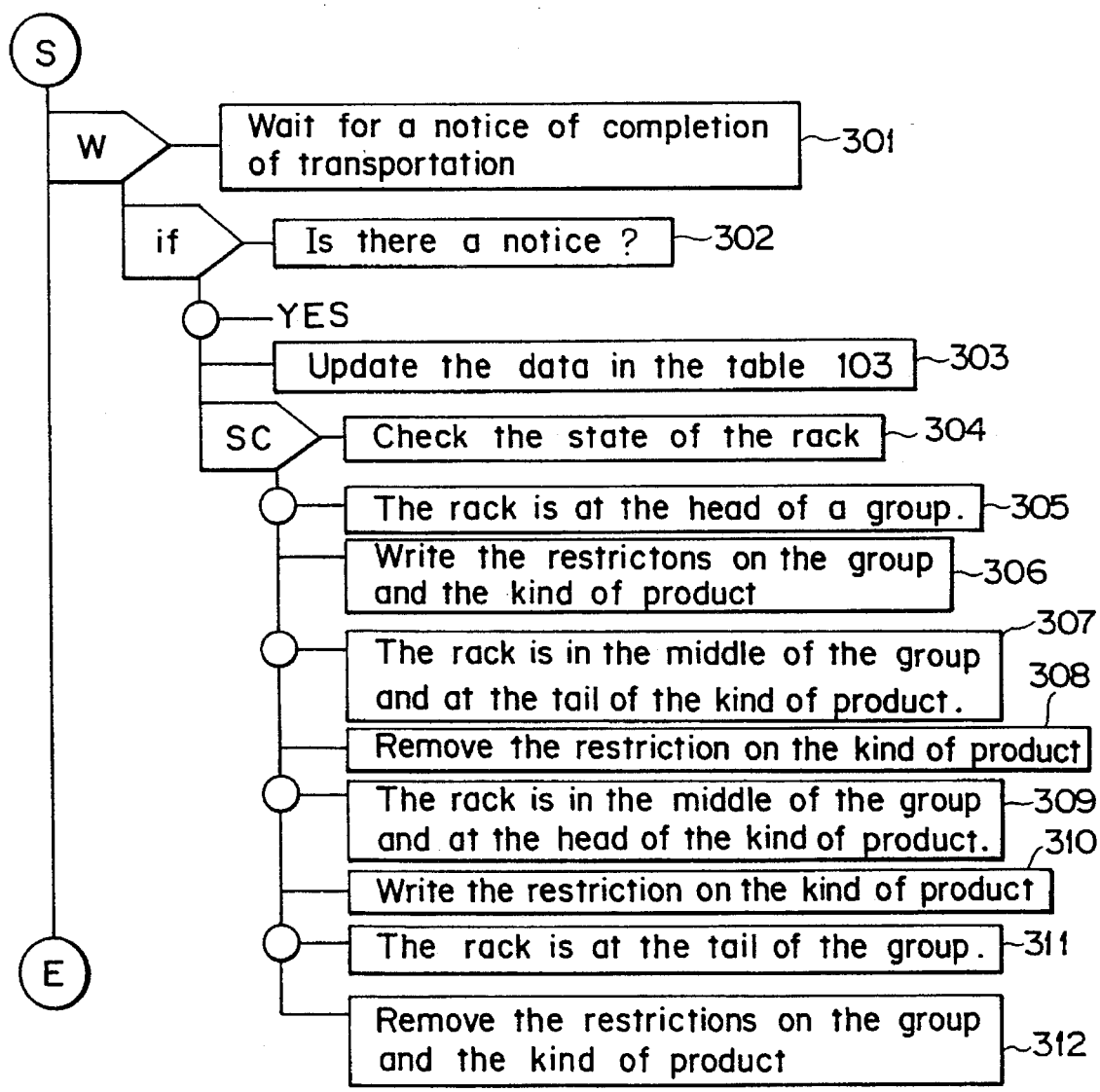
FIG. 9 is a flow chart of a process 59 in FIG. 7.

FIG. 9 shows a flow chart of the process 59 in the present embodiment. First, in the step 301, the process enters a loop waiting for a notice of completion of transportation. When there is a notice (step 302), the process advances to the step 303 and, therein, updates the data about the state of progress in the table 103. The process then advances to the step 304 and, therein, checks the state of the rack corresponding to the notice of completion of transportation. When the rack is at the head of a group (step 305), the process advances to the step 306 and, therein, writes the restrictions on the group and the kind of product into the table 102. When the rack is in the middle of the group and at the tail of the kind of product (step 307), the process advances to the step 308 and, therein, removes the restriction on the kind of product. When the rack is in the middle of the group and at the head of a kind of product (step 309), the process advances to the step 310 and, therein, writes the restriction on the kind of product into the table 102. When the rack is at the tail of the group (step 311), the process advances to the step 312 and, therein, releases the restrictions on the group and the kind of product.

FIG. 11 is a diagram explanatory of the unitization of the racks to be charged to the processing apparatus #1 extracted from FIG. 10A. FIG. 11 shows that, when the racks unitized for each group are to be charged, the racks R1, R2, R3, and R4 commonly belonging to the group G1 should be charged in succession, and when the racks unitized for each kind of product are to be charged, the racks R1 and R2 commonly used for the kind of product Z1 should be charged in succession and the racks R3 and R4 commonly used for the kind of product Z2 should be charged in succession.

Figure 12:
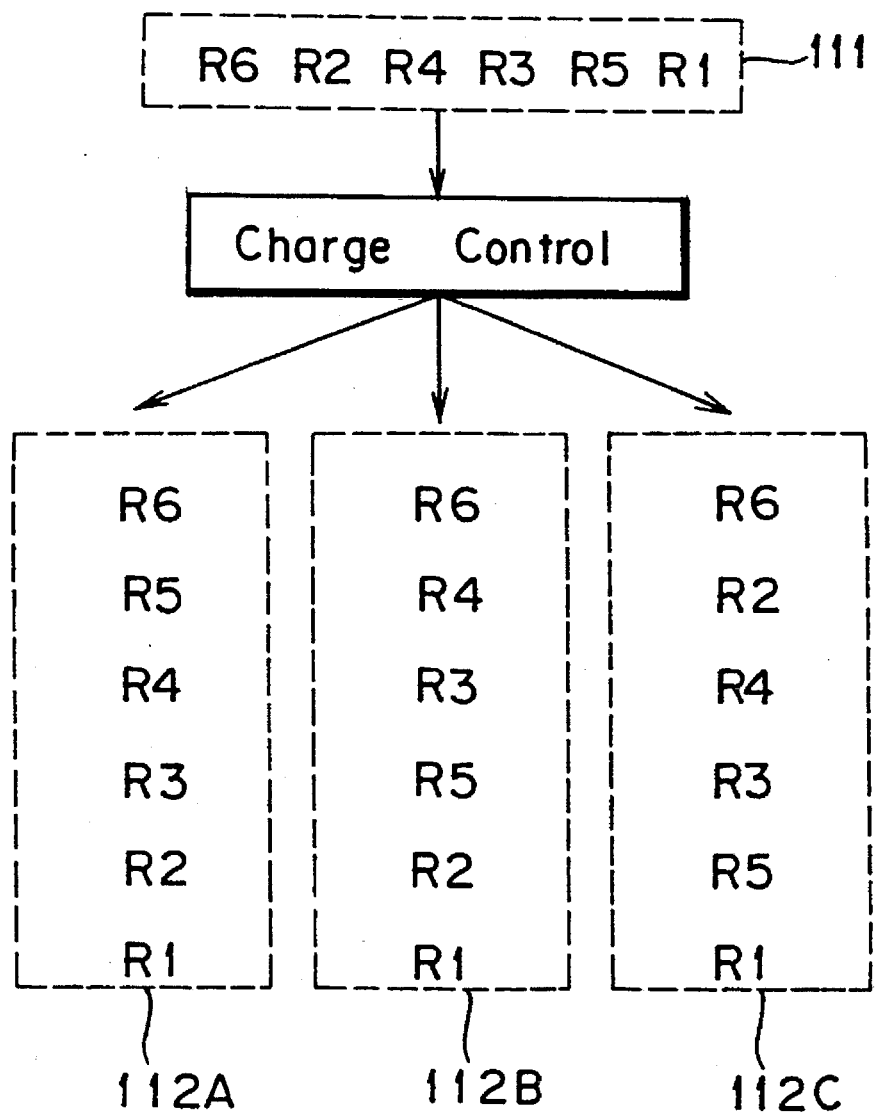
FIG. 12 is a diagram explanatory of the order of charging of racks unitized as shown in FIG. 11.

FIG. 12 is a diagram explanatory of the order of charging of racks unitized in either of the types of unitization shown in FIG. 11. We assume that the sequence of inputs to an input buffer 111 corresponding to the queue is in the order of R1, R5, R3, R4, R2, and R6. When the racks are to be charged unitized for each group, the racks are charged in the order shown in 112A, i.e., in the order of R1, R2, R3, R4, R5, and R6, as apparent from the contents shown in FIG. 10A and FIG. 11. When the racks are to be charged unitized for each kind of product, the racks are charged in the order shown in 112B, i.e., in the order of R1, R2, R5, R3, R4, and R6. On the other hand, when it is not necessary to charge racks unitized for either the group or the kind of product, the racks are charged in the same order as they arrived at the input buffer 111 as shown in 112C, i.e., unitized for individual rack. Taking the production line shown in FIG. 2 as an example, the small part mounting machine 15 is considered to be the cell to which the racks unitized for each group should be charged and the solder printing machine 13 is considered to be the cell to which the racks unitized for each kind of product should be charged, while the reflow furnace 17 and others are considered to be the cells to which the racks can be charged unitized for individual rack.

Figure 13:
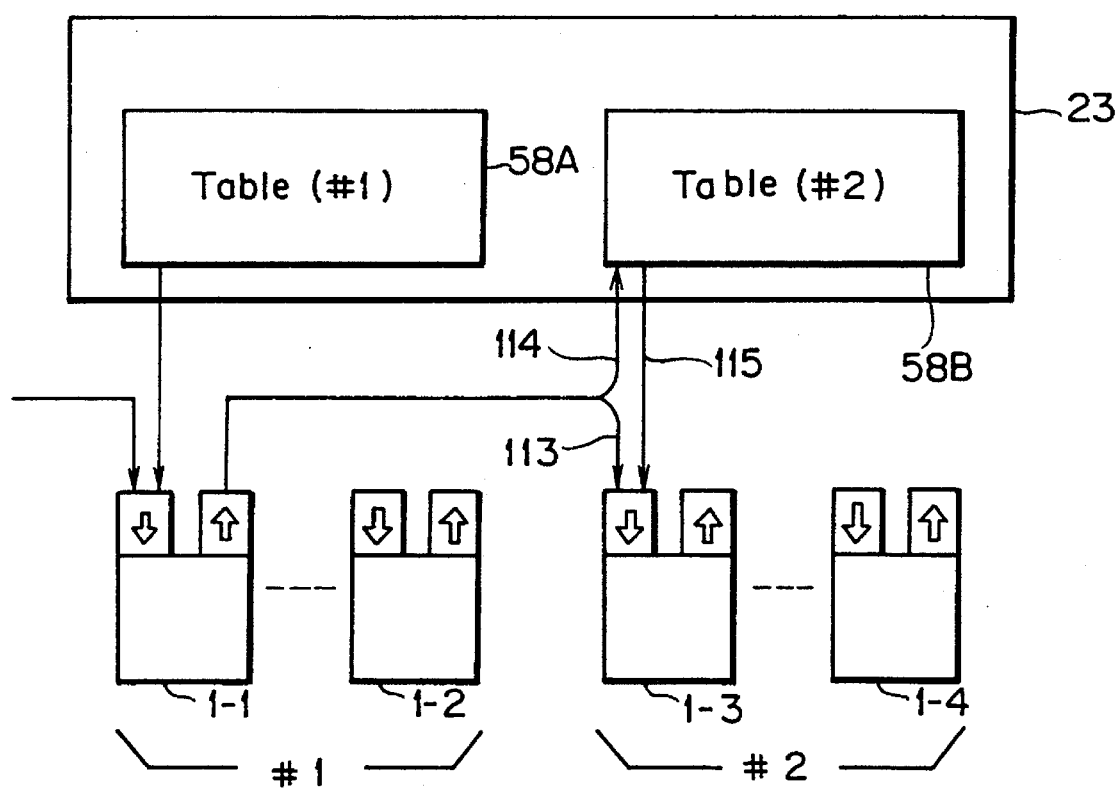
FIG. 13 is a diagram explanatory of flows of racks.

FIG. 13 is a diagram explanatory of flows of racks in the embodiment shown in FIG. 7 to FIG. 12. We assume now that the cell 1—1 and cell 1-2 belong to the processing apparatus #1 and the cell 1-3 and cell 1-4 belong to the processing apparatus #2. Table 58A stores information about the racks to be used for the processing apparatus #1 out of the racks stored in the storage, while table 58B stores information about the racks to be used for the processing apparatus #2 out of the racks stored in the storage.

When a request for taking out is made from the cell 1—1, if there is a cell (cell 1-3) in the processing apparatus #2, which is the one next to the processing apparatus #1, making a request for sending in matching the restriction, the rack sent out from the cell 1—1 is directly sent to the cell 1-3 as indicated by the arrow 113. If there is no cell making a request for sending in matching the restriction in the processing apparatus #2 when the request for taking out is made from the cell 1—1, the rack sent out from the cell 1—1 is temporarily stored in the storage 23 as indicated by the arrow 114. Information of such event is stored in the table 58B for the processing apparatus #2. On the other hand, when a request for sending in is made from the cell 1-3, if there is information about a rack matching the restriction stored in the table 58B for the processing apparatus #2, that rack is sent from the storage 23 to the cell 1-3 as indicated by the arrow 115. By grouping racks with processing conditions etc. of each of the processing apparatuses taken into consideration and charging unitized racks for each group to the cells such as the small part mounting machine, the number of times to make setups can be reduced and, thereby, operating efficiency of the apparatuses can be improved.

Below will be given description of transportation of a pallet between the automatic organizer 12 (refer to FIG. 2) as the cell for organizing pallets and the small part mounting machine 15 (refer to FIG. 2). Information necessary for transportation of pallets is stored in each table as follows, which will be described with reference to FIG. 4.

The table 75 stores information about contents of the organization of pallets. The table 71 stores information about pallets (with cartridges mounted thereon) before use stored in the storage. The table 72 stores, for each cell, information about empty pallet after use stored in the storage. The queue 73 stores, for each cell, information about a pallet whose destination is decided. The table 69 stores information about requests for sending in of a pallet from the automatic organizer 12 and the small part mounting machine 15. The table 68 stores information about requests for taking out of a pallet from the automatic organizer 12 and the small part mounting machine 15.

Figure 14:
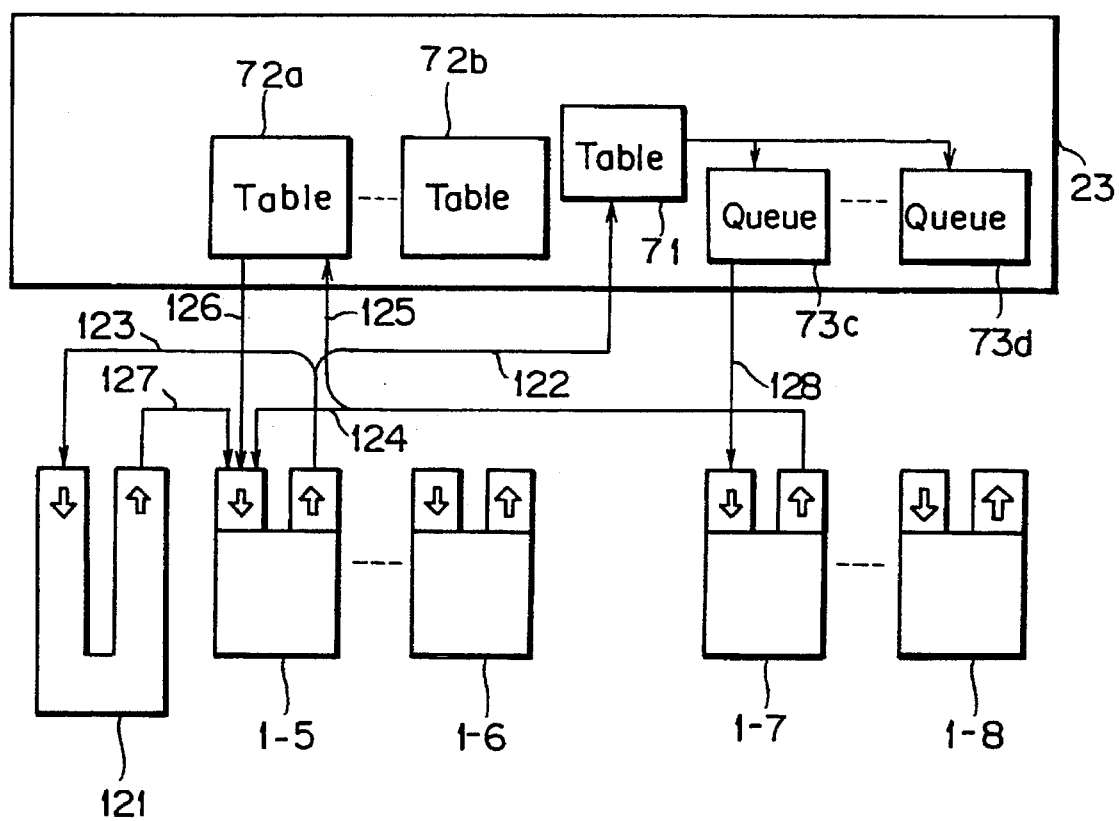
FIG. 14 is a diagram explanatory of flows of pallets.

Transportation control of pallets in accordance with these stored contents will be described below with reference to FIG. 14. In FIG. 14, the cell 1-5 and the cell 1-6 correspond to the automatic organizer, and the cell 1-7 and the cell 1-8 correspond to the small part mounting machine. Reference numeral 72a denotes the portion of the table 72 concerning the cell 1-5 and 72b denotes the portion concerning the cell 1-6, while 73c denotes the portion of the queue 73 concerning the cell 1-7 and 73d denotes the portion concerning the cell 1-8. Reference numeral 121 denotes a conveyer as a buffer means for temporarily storing empty pallets.

(1) Transportation control in response to a request for taking out from the automatic organizer:

① When a pallet with predetermined cartridges mounted thereon is sent out from the cell 1-5, the pallet is temporarily stored in the storage 23 and the relative data is stored in the table 71 as indicated by the arrow 122. Then, when a group of the racks to be charged to the cell 1-7 or cell 1-8 is decided, i.e., when the sending in of the rack at the head of the group is decided, the data corresponding to the pallet to be used by the group is taken out from the table 71 and stored into the queue 73c or 73d.

② When an empty pallet is sent out from the cell 1-5, the empty pallet is carried into the conveyer 121 as indicated by the arrow 123.

(2) Transportation control in response to a request for taking out from the small part mounting machine:

① As for the pallet about to be sent out from the cell 1-7, when the table 72a of the cell by which the pallet was organized (which cell is assumed to be the cell 1-5) is empty and there is a request for sending in from the cell 1-5, the pallet is sent into the cell 1-5 as indicated by the arrow 124.

② When the conditions mentioned in ① above are not satisfied, the pallet is sent into the storage 23 as indicated by the arrow 125 and the relative data is stored into the table for that cell.

(3) Transportation control in response to a request for sending in from the automatic organizer:

① When there is data about an empty pallet stored in the table 72a, the pallet is sent into the cell 1-5 from the storage 23.

② When there is no pallet stored in the table 72a or 72b, and there is a request for taking out made from the conveyer 121, the empty pallet is sent into the cell 1-5 from the conveyer 121 as indicated by the arrow 127.

(4) Transportation control in response to a request for sending in from the small part mounting machine:

When there is a pallet stored in the queue 73c, the pallet is sent from the storage 23 into the cell 1-7 making the request for sending in, as indicated by the arrow 128.

By carrying out the series of operations as described above, transportation of pallets following the movement of racks can be realized.

When the production line as shown in FIG. 2 is actually operated, it sometimes becomes necessary to restrict charging of a rack to a processing apparatus, as exemplified below:

① Where there is a danger that the total number of racks in a production line will exceed an allowable limit, charging of a rack to the processing apparatus at the head of the production line must be restricted.

② Where a cell becomes inoperative due to trouble or the like, charging of a rack to such cell must be restricted.

③ Where there is set a limit on the time taken by a printed circuit board as the object of processing in going from a processing apparatus to another processing apparatus, charging of a rack to the former processing apparatus must be restricted.

Methods for placing such restrictions as described above on charging will be described below:

Restriction on charging relative to ① above:

The total number of the racks in process in the processing apparatuses of the production line and the Packs stored in the storage is detected and the charging of a rack to the processing apparatus at the head of the line is restricted such that the total number of the racks will not exceed the allowable limit. To be concrete, when the total number of the racks within the line has exceeded the allowable limit, a charge restricting flag is set up by the process 62 in FIG. 4 in the table 55 at the portion corresponding to the processing apparatus at the head (the ID labeler 11 in FIG. 2). By so doing, the total number of the racks within the line can be controlled to be below the allowable limit and, thereby, the racks can be prevented from becoming immovable in the line.

Restriction of charging relative to ② above:

The alarm from each cell controller is analyzed and charging of a rack to an inoperative cell is restricted. To be concrete, a monitoring process is added which sets up a charge restricting flag in the tables 55, 56, 68, and 69 in response to the alarm signal from each of the cell controllers distributed by the command distribution process 53 of FIG. 4. Thereby, charging of a rack or the like to a cell which is not operating due to trouble or the like can be restricted and repair or other treatment of the cell can be done quickly.

Restriction of charging relative to ③ above:

The time required by a rack to go from a processing apparatus within the line to another processing apparatus is periodically forecasted and, when the forecasted time exceeds a predetermined time limit, charging of the rack to the former processing apparatus is restricted. The forecast, to be concrete, is performed in the following manner. That is, for each of the processing apparatuses from the former processing apparatus to the latter processing apparatus, the time required by the rack in process in the processing apparatus to go through the processing therein and the times required by the racks on standby in the queue of the processing apparatus and the racks expected to come into the standby state to go through the processing therein are added up, the sum total is divided by the number of cells belonging to the processing apparatus, and such divided times for all of the apparatuses are accumulated, and thereby the above described forecasting is made. More detailed explanation will be given below.

In a production line shown in FIG. 2, for example, there is a limit in the time required by a printed circuit board to be provided with various parts mounted thereon and then finished with soldering in the reflow furnace 17 after it has been printed with solder cream by the solder printer 13. The reason for this is that it is possible that good soldering quality cannot be obtained if soldering is not carried out within a limited time after the solder cream has been printed on the board. Therefore, the time taken until the reflow is completed after the solder cream has been printed is periodically forecasted and charging of a rack to the solder printer 13 is restricted if the forecasted time exceeds the limited time.

Figure 15:
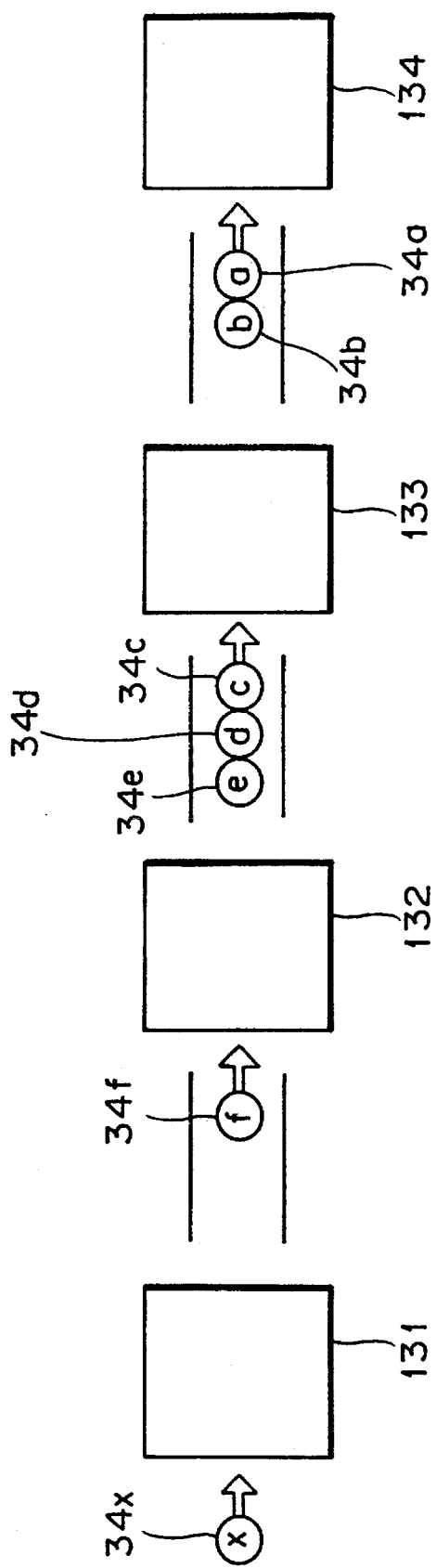
FIG. 15 is a diagram explanatory of a route of process from a solder printer to a reflow furnace.

An example of the route of processing from the solder printer to the reflow furnace is shown in FIG. 15. In this example, a processing apparatus 131 comprising a solder printer, processing apparatuses 132 and 133, and a processing apparatus 134 comprising a reflow furnace are arranged in the order named. The processing apparatuses 132 and 133 include for example a small part mounting machine. We now consider the case where it is determined whether or not the rack 34x should be charged to the processing apparatus 131. Here, it is assumed that there are racks 34a and 34b in the queue of the processing apparatus 134, there are racks 34c, 34d, and 34e in the queue of the processing apparatus 133, and there is a rack 34f in the queue of the processing apparatus 132 at this time. When simulating the time required for processing in the processing apparatus 133, the sum total of the time required for processing of the rack in process in the processing apparatus 133 (in the present example, this time is zero because there is no rack in process there), the times required for processing in the processing apparatus 133 of the racks 34c, 34d, and 34e on standby in the queue of the processing apparatus 133, and the times required for processing in the processing apparatus 133 of the racks 34f and 34x which are expected to come into a standby state in the queue of the processing apparatus 133 is calculated, and this sum total is divided by the number of cells belonging to the processing apparatus 133 (for example 2), and the result thus obtained is taken as the time required for processing in the processing apparatus 133. Similar calculations are performed for all of the processing apparatuses and the accumulated value of the times required for processing in these processing apparatuses is obtained. Thus, the time required by the rack to be finished with processing in the processing apparatus 133 after it has been charged to the processing apparatus 131 can be easily simulated with necessary accuracy.

Figure 16:
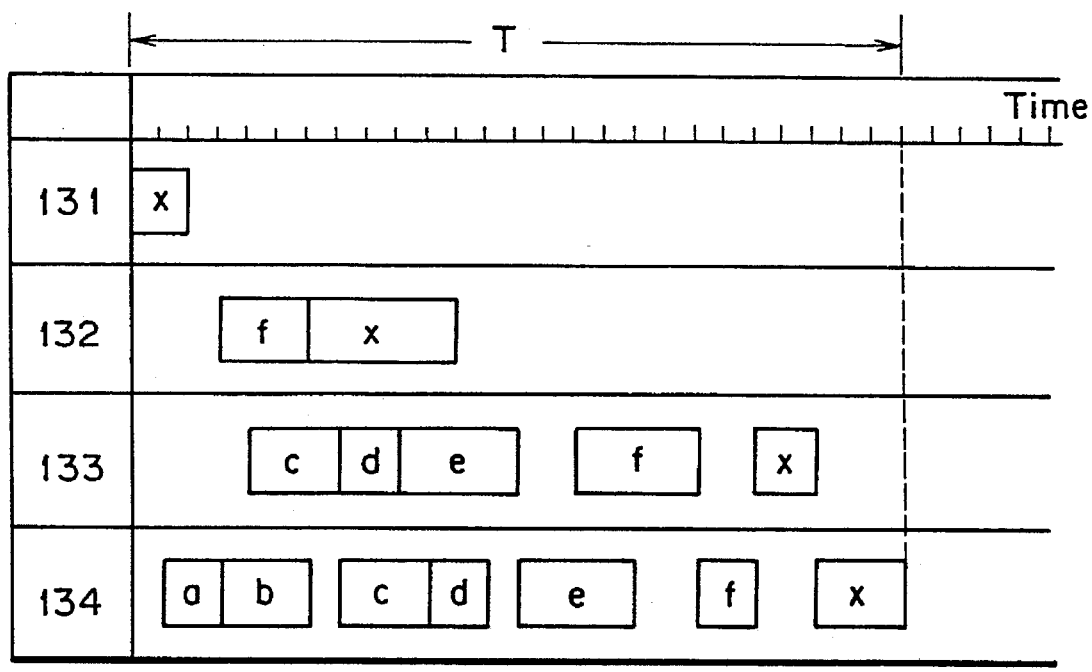
FIG. 16 is a diagram showing a result of a simulation of the required time by racks in the route of process shown in FIG. 15.

An example of a result of the simulation of the time required by a rack in going through the route of processing from the processing apparatus 131 to the processing apparatus 134 is shown in FIG. 16. In the event that the required time T forecasted by the simulation exceeds the time limit, charging of a rack to the processing apparatus is restricted. Thereby, inferior products are prevented from being produced due to expiration of the limited time for the printed solder cream and the production yield can be improved.

By performing the control of charging as described above, the racks can smoothly flow through the production line and the printed solder cream does not exceed the limited time unless there is a processing apparatus out of order. However, when any of the processing apparatuses gets out of order, there will be produced a large quantity of stocks between processing apparatuses and such stocks will become inferior products. Therefore, in order to cope with the trouble occurring in the processing apparatus, it is required to control the quantities of the stocks between the processing apparatuses to suitable values. To achieve this, it is preferred for example to provide a buffer condition control table for controlling the numbers of racks within the buffers between processing apparatuses, and according to the conditions in the table, a rack discharged from a processing apparatus may be directly transported to the next processing apparatus or a rack discharged from a processing apparatus may be stored in the storage as a temporary measure.

In embodying the present invention, it may be practiced to provide an express product flag for example in the table 103 shown in FIG. 7 and, when a request for sending in is made by a cell which is free from the restriction, to charge the rack for which the express flag is set up preferentially to the cell free from the restriction. By so doing, it becomes possible to process individually and preferentially the product whose time of delivery is close at hand.

By providing the charge control system with a customized function whereby organization of processing apparatuses and details of attributes of each processing apparatus, such as the type of unitization of charges, can be changed corresponding to such external factors as kinds of products, quantities of products ordered, and parts used, it becomes possible to make the production line capable of flexibly coping with changes in the external factors. This will be described below in more detail.

Figure 17:
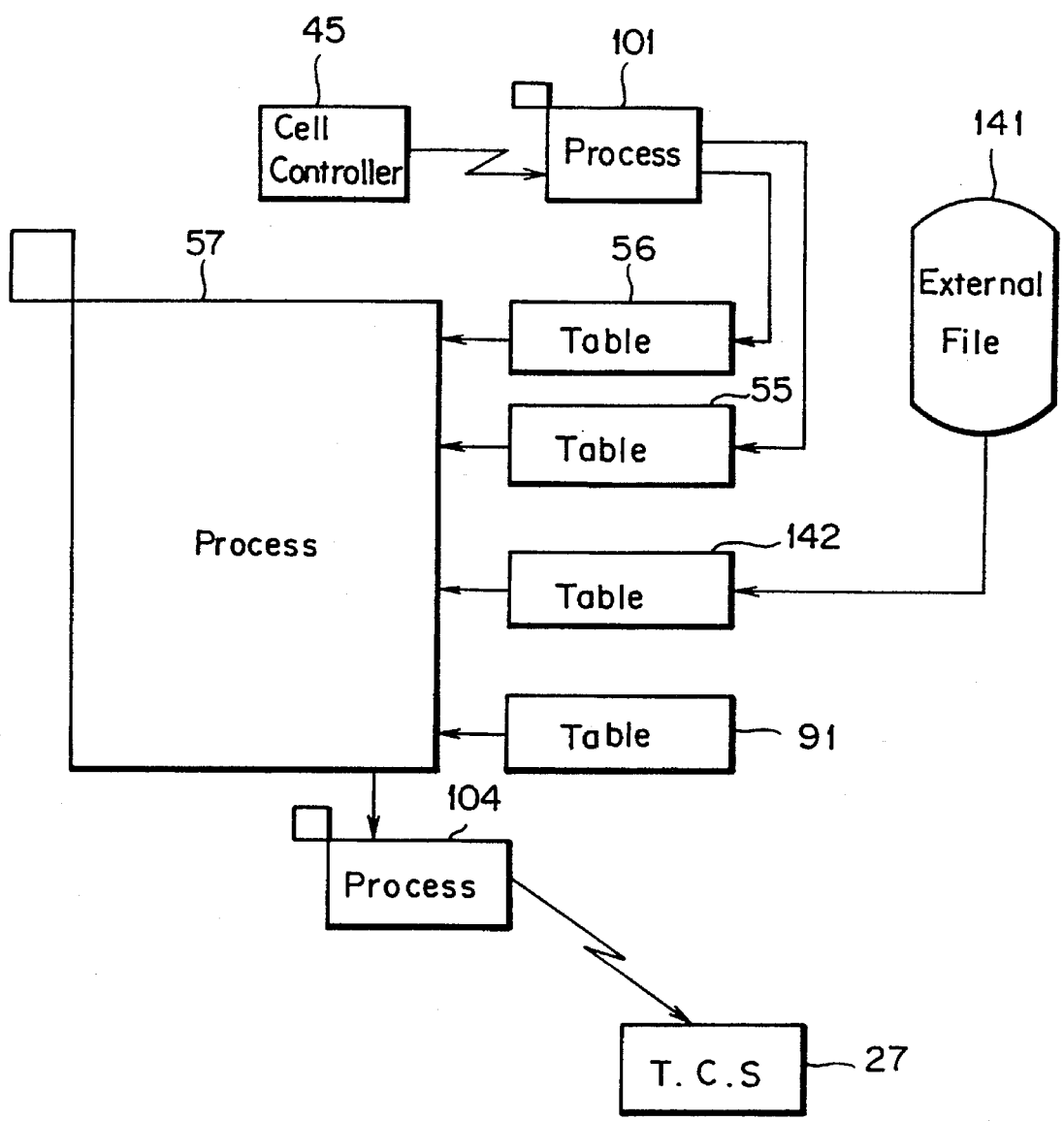
FIG. 17 is a diagram of processes interrelationship showing an embodiment of charge controlling having a customized function added thereto.

FIG. 17 is a diagram of processes interrelationships showing an embodiment of charge control having a customized function added thereto. In this embodiment, there is additionally provided an external file 141 for storing information about attributes of the processing apparatuses which has been input according to production planning, and it is adapted such that a table 142 is prepared according to information from the external file 141 at the time of start of the charge control system.

FIG. 19 is a diagram showing an example of the table 142. Information stored in the table 142 is the processing apparatus Nos. in the column A, the processing apparatus names in the column B, the cell Nos. in the column C, and other items of information in the columns D to I. By referring to the registered cell No., the number of cells belonging to the processing apparatus can be known. The column D is for indicating the type of unitization of charges, i.e., "01" indicates that charges are unitized by the group, "02" indicates that charges are unitized by the kind of product, and "03" indicates that charges are unitized by individual rack. The column E is for indicating the kind of processing apparatus, i.e., "01" indicates that the processing apparatus is a manufacturing apparatus, "02" indicates that the processing apparatus is a testing apparatus, "03" indicates that the processing apparatus is a correcting apparatus, and "04" indicates that the processing apparatus is an apparatus of other kind. The column F is for setting up a flag therein indicating whether or not the processing apparatus requires confirmation that the pallets for each unitized group are complete. The column G is for setting up a flag therein indicating whether or not there is a loader (a sending in conveyer). The column H is for setting up a flag therein indicating whether or not there is an unloader (a taking out conveyer). The column I is for setting up a flag therein indicating whether or not the processing apparatus uses a pallet.

Figure 18:
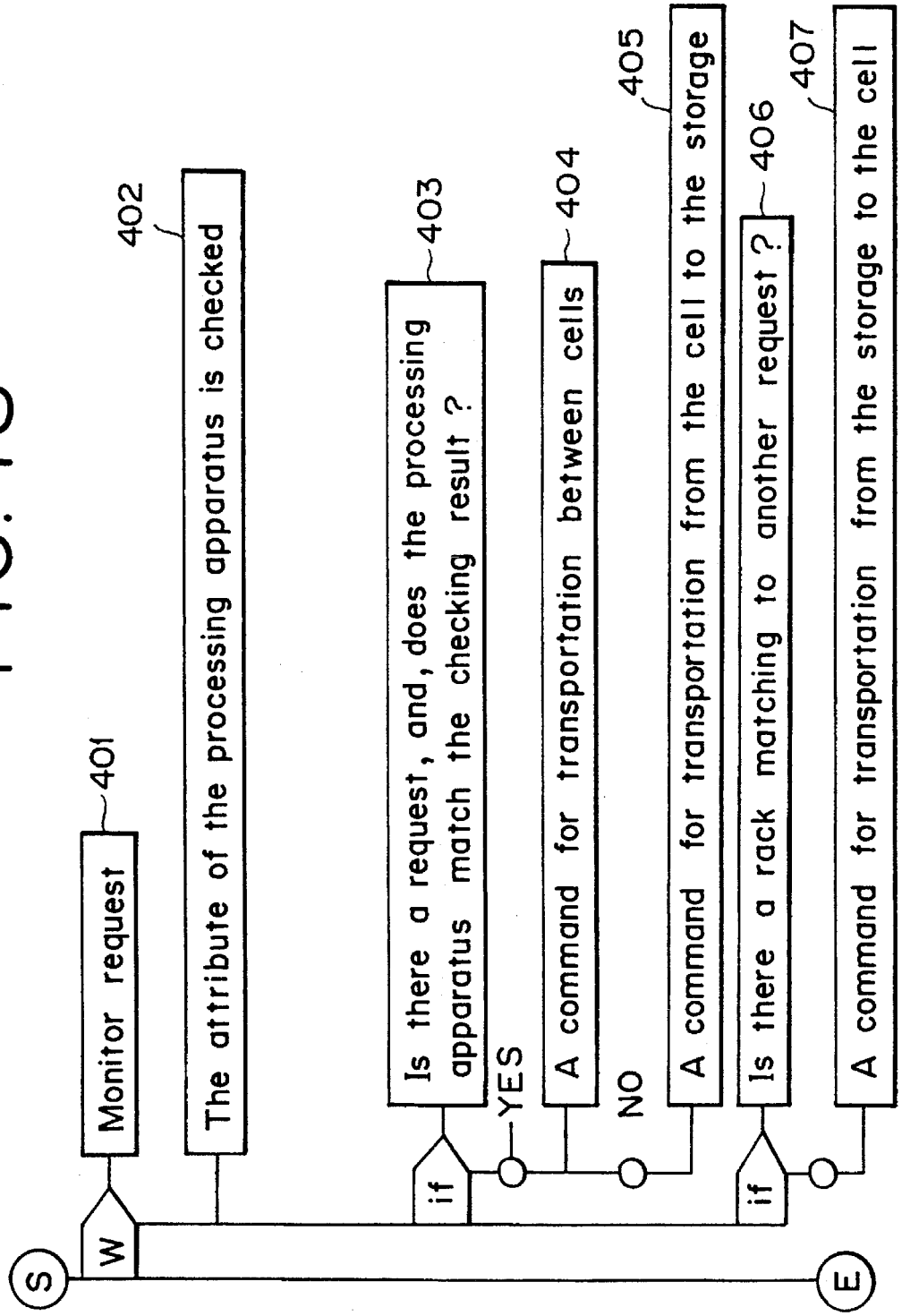
FIG. 18 is a flow chart of a process 57 in FIG. 17.

A flow chart of the process 57 in FIG. 17 is shown in FIG. 18. First, in the step 401, the process enters a loop monitoring requests for sending in/taking out from cells. Then, in the step 402, the attribute of the processing apparatus wherein a rack, taking out of which is requested by a processing apparatus, is to be processed in the next step is checked according the table 142 of FIG. 19. The items to be checked are "what is the type of unitization of charges ?", "what is the kind of the processing apparatus ?", "is it necessary to confirm that pallets for each unitized group are complete ?", etc. Then, in the step 403, it is decided whether or not there is a request for sending in from a processing apparatus and the processing apparatus matches the attribute of a processing apparatus checked in the step 402. When there is a request for sending in and the processing apparatus matches the attribute, the process advances to the step 404 and therein a command for transportation between cells is issued. When there is no request for sending in or the processing apparatus does not match the attribute, the process advances to the step 405 and therein a command for transportation from the cell to the storage is issued. Then, in the step 406, it is decided whether or not there is a rack, which matches the attribute for another request for sending in, in the racks on standby in the storage. When there is such rack, the process advances to the step 407 and therein a command for transportation of the rack from the storage to the cell is issued. Then, referring to the table 142, distribution of processing apparatuses to cells and charging of racks and pallets to cells in accordance with the production planning are performed.

By preparing a suitable table using the external file according to orders as described above, the present invention can be practiced without changing substantially the programs for charge controlling.

Figure 20A:
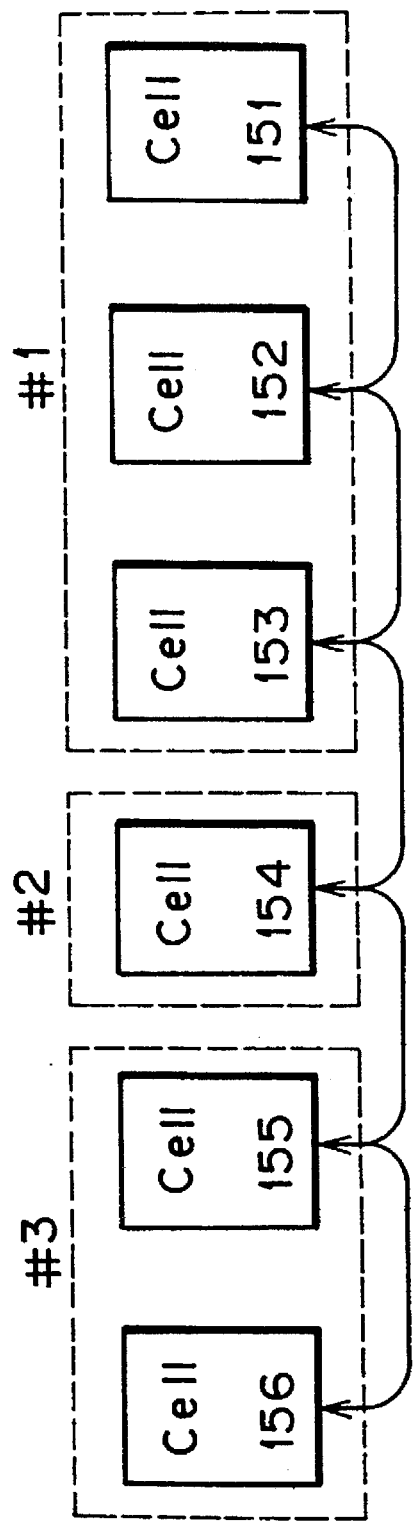
FIG. 20A is a diagram showing a state of distribution of cells to the processing apparatuses before a change has been made in the distribution.
Figure 20B:
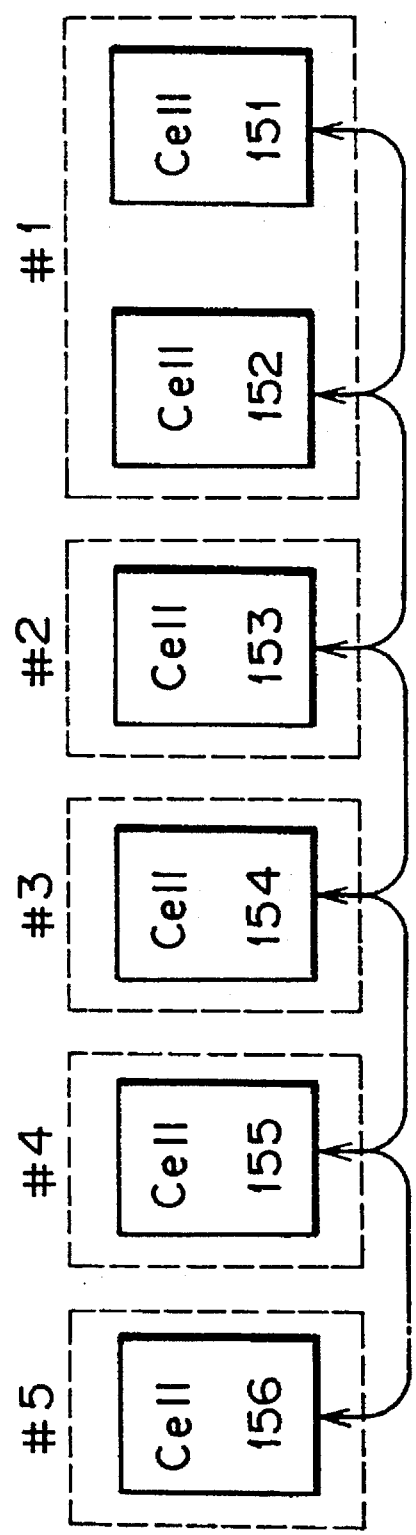
FIG. 20B is a diagram showing a state of distribution of cells to the processing apparatuses after the change has been made.

Further, by changing distribution of cells to the processing apparatuses according to work load at the time when for example the kind of product is changed, effective running of the apparatuses can be attained. Examples of the states of distribution of cells to the processing apparatuses before and after such change are shown in FIG. 20A and FIG. 20B, respectively. Before the change, as shown in FIG. 20A, the processing apparatus #1 was constituted of the cells 151, 152, and 153, the processing apparatus #2 was constituted of the cell 154, and the processing apparatus #3 was constituted of the cells 155 and 156. Such distribution can be changed to that shown in FIG. 20B, for example. That is, after the change, the processing apparatus #1 is constituted of the cells 151 and 152, the processing apparatus #2 is constituted of the cell 153, the processing apparatus #3 is constituted of the cell 154, the processing apparatus #4 is constituted of the cell 155, and the processing apparatus #5 is constituted of the cell 156.

According to the present invention as described above, an advantage obtained is that a production control system versatile and suitable for application to unmanned and highly effective running of an entire production line producing multiple kinds of products,synthetically can be provided.

In a system as the product control system of the present invention in which a plurality of processes make interrelated processing on an on-line basis, matching between states of processes and data bases is sometimes lost if a process is forced to stop its functioning disregarding states of other processes. Therefore, in such a case where a process gets out of order and this process has to be unavoidably stopped, it is required that the process control is performed such that the effect of the stoppage on the other processes may be minimized. To achieve this, it will be favorable to additionally provide a first process for process controlling to perform centralized control of the processes, a second process for stopping the process in trouble according to a stopping command, and a process control table storing states of the processes according to information provided from the first and second processes, and to thereby exercise centralized control of starting and stopping of the processes.

While the invention has been described with reference to particular embodiments, these embodiments are given by way of illustration only and not limitative of the present invention. The scope of the invention is defined by the appended claims and all changes and modifications as fall within the equivalence of the scope of the claims are therefore to be embraced by the invention.

What is claimed is:

1. A production control system for a printed circuit board production line for producing a variety of products containing printed circuit boards, comprising:

a host computer including a charge control system having a database;

a plurality of production cells including an identification labeler, a solder printer, at least one part mounting machine and a reflow furnace;

said database storing data for operating said production cells;

storage means for temporarily storing parts accommodating a plurality of printed circuit boards and a plurality of elements to be mounted to said plurality of printed circuit boards;

transportation means coupled to said storage means and said cells for transporting said parts both between said cells and between said cells and said storage means;

said parts for accommodating a plurality of printed circuit boards including a plurality of racks for storing a plurality of printed circuit boards, and said parts for accommodating a plurality of elements including a plurality of pallets holding cartridges for storing a plurality of elements to be mounted to said plurality of printed circuit boards according to each of the variety of products being produced;

a single physical distribution control unit directly coupled to said charge control system of said host computer and being common to all said production cells for controlling said transportation means in response to a transportation command received from said charge control system of said host computer; and a plurality of cell controllers each operatively connected with a respective one of said plurality of cells and all coupled with said charge control system of said host computer, for transporting data from the database of said charge control system to the respective one of said plurality of cells for controlling said cells, each of said plurality of cell controllers detecting status information of said respective one of said plurality of cells and transmitting the status information to said charge control system;

said charge control system comprising a first command distribution means coupled to said cell controllers, for issuing said transportation command to said physical, distribution control unit in response to one of a request for sending in one of said parts, received from said plurality of cell controllers, and a request for taking out one of said parts, received from said plurality of cell controllers, a second command distribution means, coupled to said physical distribution control unit, for issuing said transportation command in response to a notice of completion of transportation received from said physical distribution control unit, and a route master for storing information on routes in the production line through which said racks are transported according to a product being produced, so that said charge control system issues said transport command to said physical distribution control system in accordance with the information stored in said route master.

2. A production control system according to claim 1, wherein said charge control system further includes a first and a second table for storing information on requests for sending in and taking out said racks from respective cells, and a queue for storing, for each of said plurality of cells, information on states of said racks on standby in said storage means so that said charge control system issues said transportation command to said physical distribution control unit also in accordance with the information stored in said first table, said second table, and said queue.

3. A production control system according to claim 1, wherein said charge control system includes a first table for storing, for each of said racks, information on which printed circuit boards are stored in a rack in accordance with a type of a product of the variety of products to be produced, information on a processing condition of said rack in each cell, and information on a cell in the route through which said rack is transported, a second table for storing information on requests for sending in said racks from said plurality of cells, a queue for storing, for each of said plurality of cells, information on status of said racks on standby in said storage means, a third table for storing information on a number of racks which accommodate printed circuit boards for the same type of product being produced, and a fourth table for storing information on restrictions imposed based upon information from said first and third tables so that said charge control system issues said transportation command to said physical distribution control unit according to information stored in said first, second and fourth tables and said queue, and updates said fourth table according to said notice of completion of transportation received from said physical distribution control unit and information stored in said first and third tables.

4. A production control system according to claim 3, wherein said first table includes an express product flag so that when said request for sending in of one of said parts is generated by a respective cell controller of a cell which is free from said restrictions, a rack for which said flag is set up is preferentially charged to said cell.

5. A production control system according to claim 1, wherein one of said plurality of cells includes said solder printer for printing solder cream onto a printed circuit board delivered thereto from a respective rack and another of said plurality of cells includes said reflow furnace for performing reflow soldering of elements mounted on said printed circuit board, said at least one part mounting machine for mounting parts onto said printed circuit board is arranged between said solder printer and said reflow furnace.

6. A production control system according to claim 1, and further comprising an external file for storing information on characteristics of said cells and production criteria, so that when said charge control system is started, a table is prepared according to information from said external file, and distribution of said cells in the production line and charging of said parts to said plurality of cells in accordance with the production criteria are performed according to said table.

7. A production control system according to claim 1, wherein said charge control system includes a first table for storing information on organization of said pallets, a second and a third table for storing information on pallets stored in said storage means before and after use, respectively, a queue for storing, for each cell, information on a pallet a destination of which is decided, and a fourth and a fifth table for storing information on requests for sending in said pallets to and requests for taking out of said pallets, from respective cells, wherein each pallet is transported following transportation of a respective rack.

8. A production control system according to claim 1, wherein said identification labeler is positioned upstream of remaining of said cells for labeling each of said plurality of printed circuit boards according to each of the variety of products produced and identifying each of said plurality of printed circuit boards for production of the variety of products during continuous operation.

* * * * *